(12) United States Patent
Xie et al.

(10) Patent No.: US 12,727,252 B2
(45) Date of Patent: Sep. 1, 2026

(54) MICROELECTRONIC STRUCTURE COMPRISING LOGIC DEVICE AND PASSIVE DEVICE WITH THINNER Si LAYER

(71) Applicant: INTERNATIONAL BUSINESS MACHINES CORPORATION, Armonk, NY (US)

(72) Inventors: Ruilong Xie, Niskayuna, NY (US); Lawrence A. Clevenger, Saratoga Springs, NY (US); Kisik Choi, Watervliet, NY (US); Terence Hook, Jericho Center, VT (US)

(73) Assignee: International Business Machines Corporation, Armonk, NY (US)

( * ) Notice: Subject to any disclaimer, the term of this patent is extended or adjusted under 35 U.S.C. 154(b) by 633 days.

(21) Appl. No.: 18/331,965

(22) Filed: Jun. 9, 2023

(65) Prior Publication Data

US 2024/0413164 A1 Dec. 12, 2024

(51) Int. Cl.

*H10D 87/00* (2026.01)
*H10D 86/01* (2025.01)
*H10D 88/00* (2026.01)
*H10W 20/41* (2026.01)

(52) U.S. Cl.

CPC ............. *H10D 87/00* (2025.01); *H10D 86/01* (2025.01); *H10D 88/00* (2025.01); *H10W 20/427* (2026.01)

(58) Field of Classification Search

None

See application file for complete search history.

(56) References Cited

U.S. PATENT DOCUMENTS

| | | | | |
|---|---|---|---|---|
| 9,455,187 | B1 | 9/2016 | Gambino | |
| 9,466,723 | B1 | 10/2016 | Huang | |
| 10,615,248 | B1 | 4/2020 | Naser | |
| 11,205,620 | B2 | 12/2021 | Naser | |
| 11,404,534 | B2 | 8/2022 | Kao | |
| 2012/0007244 | A1* | 1/2012 | Harrison | H10P 50/242 257/E23.012 |
| 2020/0411636 | A1 | 12/2020 | Kao | |
| 2021/0111115 | A1 | 4/2021 | Morrow | |
| 2021/0134721 | A1 | 5/2021 | Chiang | |
| 2021/0202385 | A1 | 7/2021 | Huang | |
| 2021/0305252 | A1 | 9/2021 | Chiang | |
| 2021/0305381 | A1 | 9/2021 | Chiang | |
| 2021/0351303 | A1 | 11/2021 | Ju | |
| 2021/0358849 | A1 | 11/2021 | Chen | |
| 2021/0376071 | A1 | 12/2021 | Liu | |
| 2021/0376093 | A1 | 12/2021 | Chu | |
| 2022/0139911 | A1 | 5/2022 | Wei | |
| 2024/0332185 | A1* | 10/2024 | Kim | H10D 84/811 |

* cited by examiner

*Primary Examiner* — Daniel Whalen

(74) *Attorney, Agent, or Firm* — Samuel A. Waldbaum

(57) ABSTRACT

A microelectronic structure including a logic device and a passive device. The passive device includes a doped substrate, a silicide layer located on a backside surface of the doped substrate, and a metal plane located on a backside surface of the silicide layer.

20 Claims, 25 Drawing Sheets

TOP DOWN VIEW OF A LOGIC DEVICE

CROSS- SECTION X

CROSS- SECTION Y

CROSS- SECTION of
PASSIVE DEVICE REGION

CROSS- SECTION X

CROSS- SECTION Y

CROSS- SECTION of
PASSIVE DEVICE REGION

CROSS- SECTION X

CROSS- SECTION Y

CROSS- SECTION of
PASSIVE DEVICE REGION

CROSS- SECTION X

CROSS- SECTION Y

CROSS- SECTION of
PASSIVE DEVICE REGION

CROSS- SECTION X

CROSS- SECTION Y

CROSS- SECTION of
PASSIVE DEVICE REGION

CROSS- SECTION X

CROSS- SECTION Y

CROSS- SECTION of
PASSIVE DEVICE REGION

CROSS- SECTION X

CROSS- SECTION Y

CROSS- SECTION of
PASSIVE DEVICE REGION

CROSS- SECTION X

CROSS- SECTION Y

CROSS- SECTION of
PASSIVE DEVICE REGION
190
144
355
350
109
N-well
H7
H3
142
P+
312
316
318
305
300
320
322
330
325
140
335
335
340
160
165

MICROELECTRONIC STRUCTURE COMPRISING LOGIC DEVICE AND PASSIVE DEVICE WITH THINNER Si LAYER

BACKGROUND

The present invention generally relates to the field of microelectronics, and more particularly to formation of a passive device along with a logic device.

Nanosheet is the lead device architecture in continuing CMOS scaling. However, nanosheet technology has shown issues when scaling down such that as the devices become smaller and closer together, they are interfering with each other. When forming a passive device a larger amount/thickness of the bulk material is need for forming the device.

BRIEF SUMMARY

Additional aspects and/or advantages will be set forth in part in the description which follows and, in part, will be apparent from the description, or may be learned by practice of the invention.

A microelectronic structure including a logic device and a passive device. The passive device includes a doped substrate, a silicide layer located on a backside surface of the doped substrate, and a metal plane located on a backside surface of the silicide layer.

A microelectronic structure including a logic device that includes a backside contact and a passive device. The passive device includes a doped substrate, a silicide layer located on a backside surface of the doped substrate, and a metal plane located on a backside surface of the silicide layer.

A method includes the steps of forming a logic device that includes a backside contact and forming a passive device. The passive device includes a doped substrate, a silicide layer located on a backside surface of the doped substrate, and a metal plane located on a backside surface of the silicide layer.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
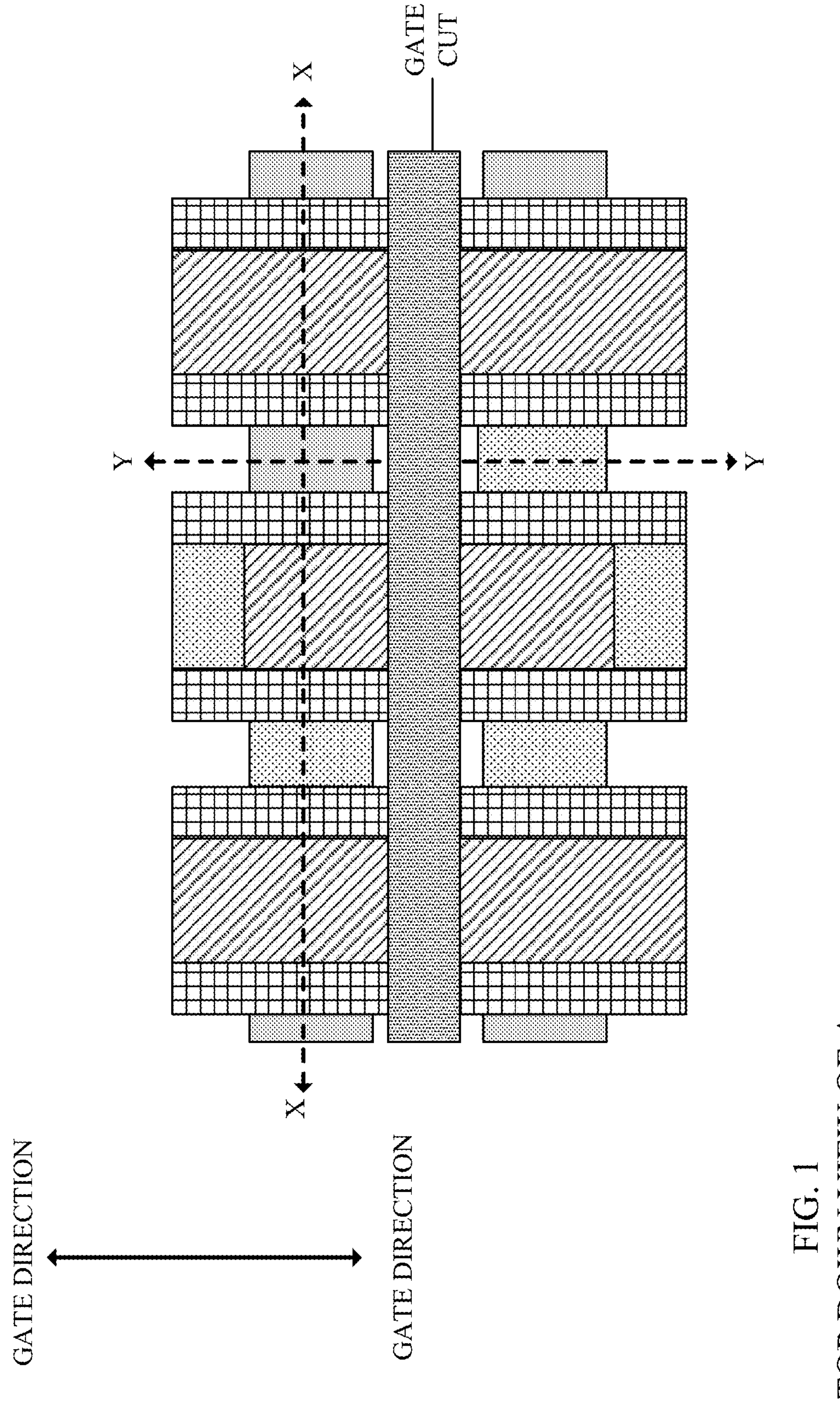
FIG. 1 illustrates a top-down view of multiple nano devices (nanosheet transistors) of a logic device, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. When forming a passive device, such as diode, along with a logic device the bulk substrate, that is part of the passive device, has a thickness that was equal to or greater than 150 nm.

In contrast, the present invention reduces the thickness of the substrate of the passive device by utilizing a thinner bulk doped substrate that has a silicide layer and a conductive metal layer located on a backside surface of the doped substrate. The silicide layer and the conductive metal layer increases the current flow through the doped bulk substrate, thus allowing a reduction of the thickness of the doped bulk substrate in the passive device. The silicide layer and the conductive metal in the passive device are formed during the formation of the backside contacts in the logic device. The reduction of the thickness/height/depth of the doped bulk substrate in the passive device also leads to a reduction in the height/thickness/depth of the backside contacts of the logic device. The conductive metal layer and the silicide layer on the doped bulk substrate compensates for the thinner nature of the doped bulk substrate, meaning that the metal layer and the silicide increase the conductivity or current flow through the doped bulk substrate. The doped bulk substrate has a thickness in the range of 20 to 50 nm, thus the combined height of the doped bulk substrate, the silicide layer, and the metal layer is less than 150 nanometers. The combined height of the doped bulk substrate, the silicide layer, and the metal layer is in the range of about 30 to 80 nm, thus the combined height/thickness/depth is significantly smaller than the thickness of 150 nm as the bulk substrate of the conventional passive device.

FIG. 1 illustrates a top-down view of multiple nano devices, or nanosheet transistors, which can be comprised of electronic components such as transistors, in accordance with the embodiment of the present invention. The cross-section X extends horizontally through the nano stacks of one of the devices, where the cross-section is perpendicular to the gate direction. Cross section Y is perpendicular to cross section X and in parallel with the gate direction, where cross section Y is through a source/drain region that spans across multiple nano stacks. A top down view of the passive device is not shown, but the cross-section of the passive device is across the gates, thus the cross-section of the passive device that is illustrated is a cross-section that is perpendicular to the gate direction.

Figure 2:
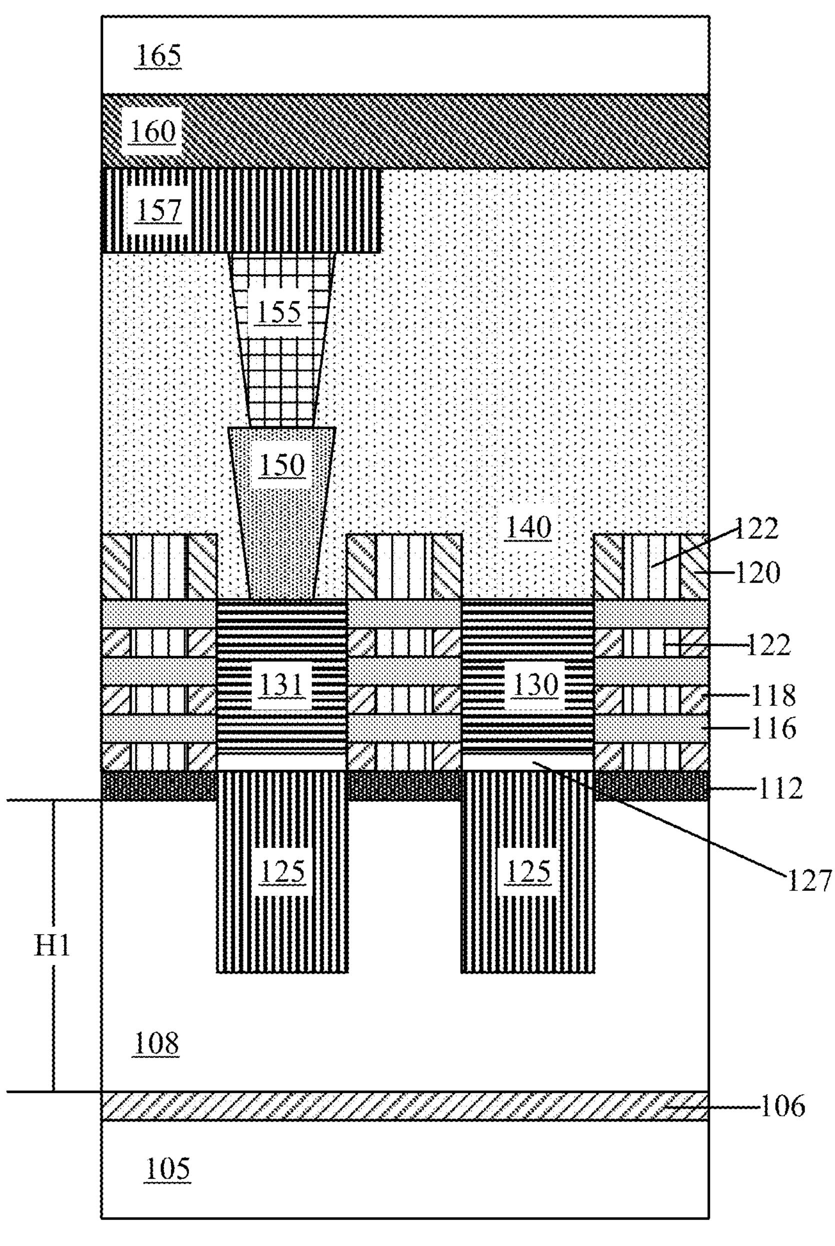
FIG. 2 illustrates a cross section X of the nano stack after the frontside processing of the nano devices of the logic device, in accordance with the embodiment of the present invention.
Figure 3:
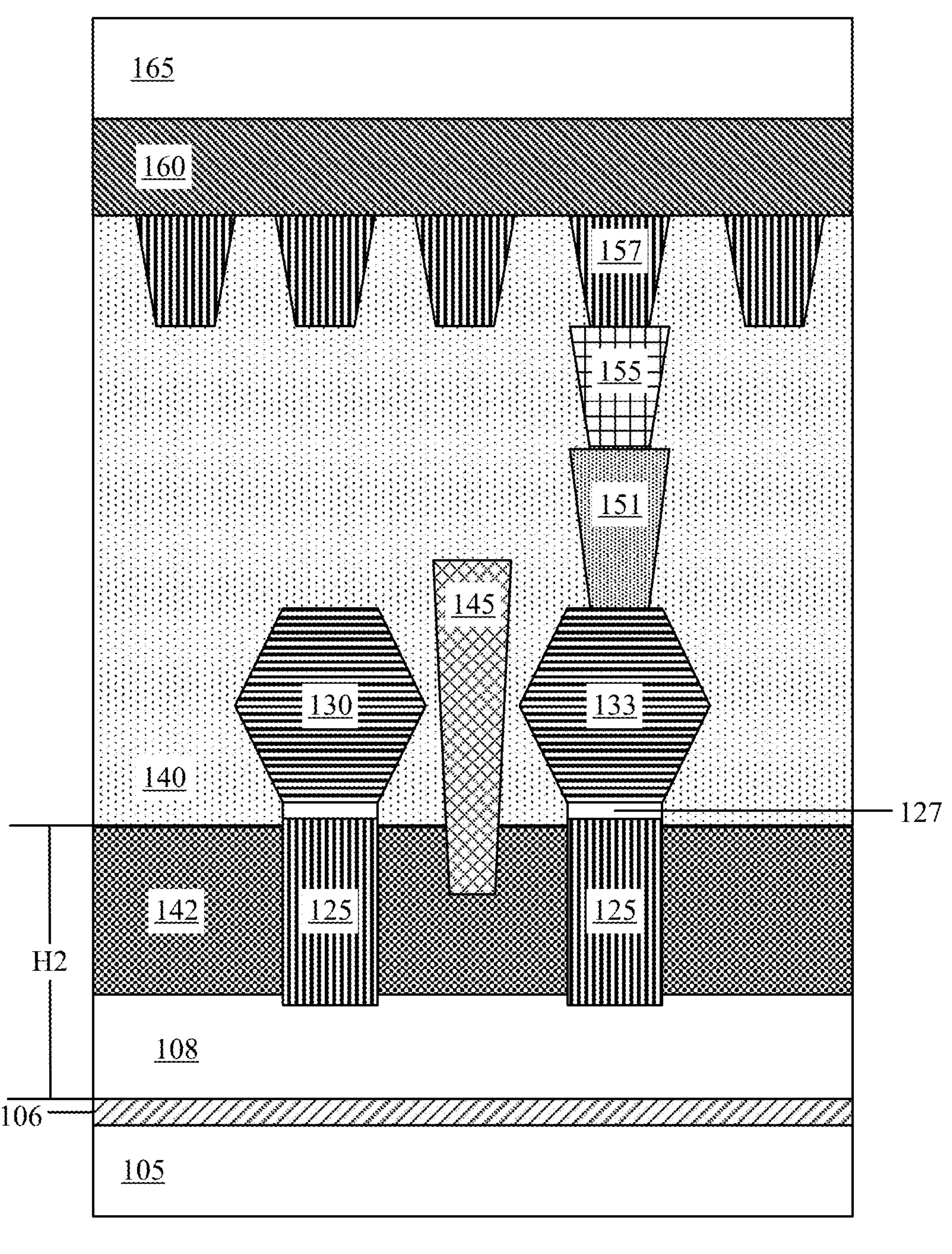
FIG. 3 illustrates a cross section Y of the source/drain region of the logic device after the frontside processing of the nano devices, in accordance with the embodiment of the present invention.

Referring now to FIGS. 2, and 3, a structure is shown during an intermediate step of a method of fabricating nano devices, such as, a nanosheet transistor structure after the completion of the frontside processing according to an embodiment of the invention.

FIGS. 2 and 3 illustrate the processing stage of the structure after completing the frontside processing of the nano devices. FIG. 2 illustrates a first substrate 105, an etch stop 106, a second substrate 110, a bottom dielectric isolation layer 112, a plurality of channel layers 116, an inner spacer 118, a gate 122, an upper spacer 120, substrate spacer 127, a first source/drain 130, a second source/drain 131, a placeholder 125, a frontside interlayer dielectric layer 140, a first frontside source/drain contact 150, a frontside via 155, a frontside metal line 157, a back-end-of-the-line (BEOL) layer 160, and a carrier wafer 165.

The first substrate 105 and the second substrate 108 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the first substrate 105 and the second substrate 108. In some embodiments, first substrate 105 and the second substrate 108 includes both semiconductor materials and dielectric materials. The semiconductor first substrate 105 and the second substrate 108 may also comprise an organic semiconductor or a layered semiconductor such as, for example, Si, SiGe, a silicon-on-insulator or a SiGe-on-insulator. A portion or the entire semiconductor first substrate 105 and the second substrate 108 may also be comprised of an amorphous, polycrystalline, or monocrystalline. The semiconductor first substrate 105 and the second substrate 108 may be doped, undoped or contain doped regions and undoped regions therein. The second substrate 108 or the bulk substrate has a thickness/depth/height H1 in a range of 20 to 50 nm. Gate 122 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W.

FIG. 3 illustrates a cross section of the source/drain region, where the cross section is in parallel with the gate direction. The source/drain region includes the substrate 105, the etch stop 106, the second substrate 108, a shallow trench isolation layer 142, placeholders 125, substrate spacer 127, the first source/drain 130, a third source/drain 133, a dielectric gate cut pillar 145, the frontside interlayer dielectric layer 140, a second frontside source/drain contact 151, a frontside via 155, a plurality of frontside metal lines 157, a back-end-of-the-line (BEOL) layer 160, and a carrier wafer 165. The second substrate 108 or the bulk substrate and the shallow trench isolation layer 142 have a combined thickness/depth/height H2 in a range of 20 to 50 nm. The thickness/depth/height H1 and thickness/depth/height H2 should be approximately equal to each other.

The first source/drain 130, the second source/drain 131, and the third source/drain 133 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 4:
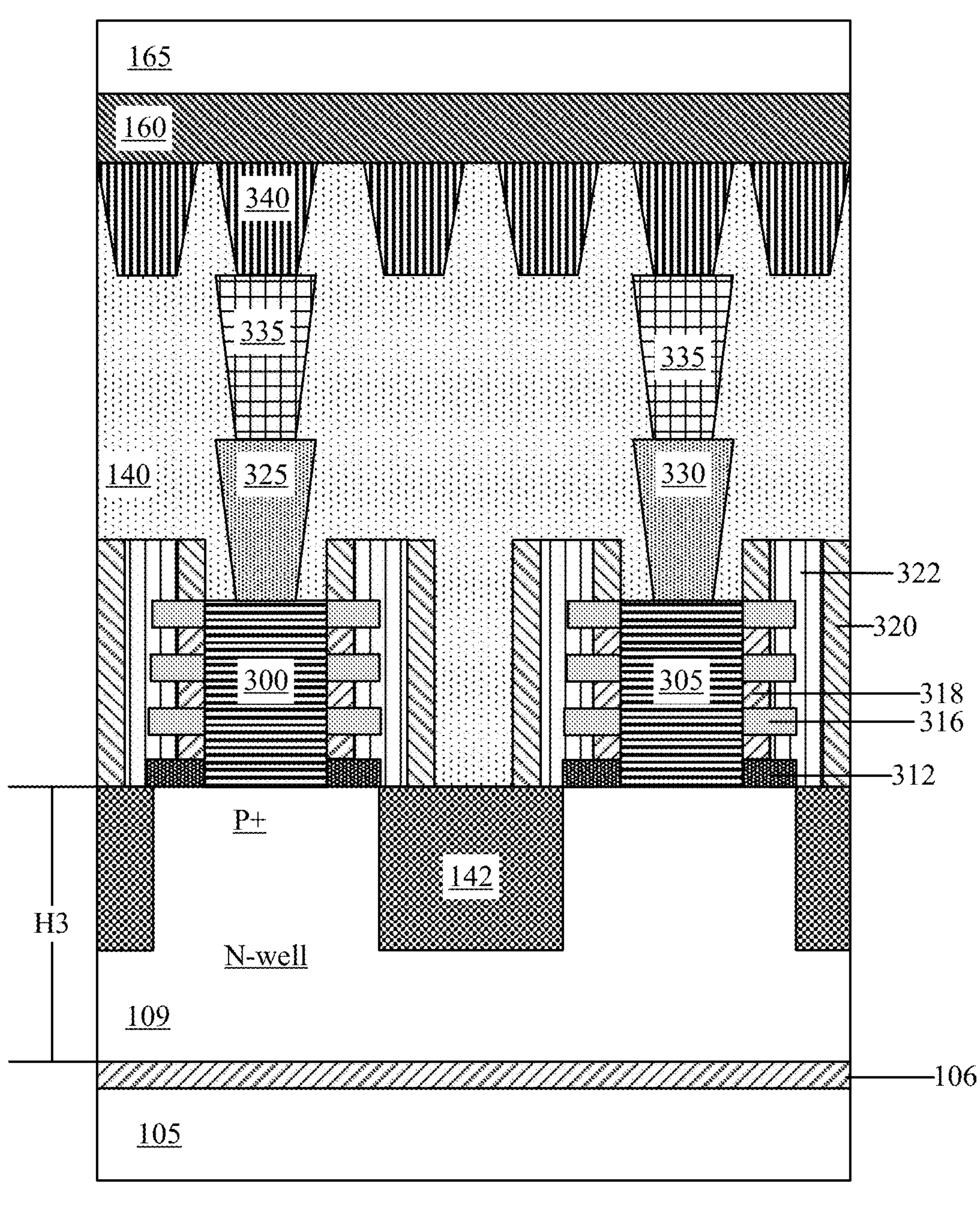
FIG. 4 illustrates a cross section of the passive device after the frontside processing, in accordance with the embodiment of the present invention.

FIG. 4 illustrates a cross-section of an exemplary passive device (PD), where the cross-section of the passive device is across the gates, thus the cross-section of the passive device that is illustrated is a cross-section that is perpendicular to the gate direction. The passive devices includes the first substrate 105, the etch stop 106, a doped second substrate 109, the shallow trench isolation layer 142, a bottom dielectric spacer 312, a plurality of channel segments 316, an inner spacer 318, a gate 322, a gate spacer 320, the frontside interlayer dielectric layer 140, a first PD source/drain 300, a second PD source/drain 305, a first PD source/drain contact 325, a second PD source/drain contact 330, a plurality of PD vias 335, a plurality of PD metal lines 340, a back-end-of-the-line (BEOL) layer 160, and a carrier wafer 165. The plurality of metal lines 340 can be the same, different, attached, or independent of the plurality of frontside metal lines 157 of the logic device. The doped second substrate 109 as illustrated shows an N-well with a P+ doping under the first PD source/drain 300. The shown doping is for exemplary purposes only and it is not meant to be seen as limiting in any ways. The doped second substrate has a thickness/depth/height H3 in a range of 20 to 50 nm. Thickness/depth/height H3 is substantially equal to the thickness/depth/height H1 and thickness/depth/height H2. The BEOL layer 160 and the carrier wafer 165 extend across both the logic device and the passive device to allow for the logic device and passive device to be simultaneously to be flipped over for backside processing, which will be described in further detail below.

Typical or conventional doped bulk substrates usually have a thickness/depth/height of about greater than or equal to 150 nm. The 150 nm thickness is needed for the conventional passive device to function, i.e., the 150 nm thickness is needed to allow for the necessary current flow through the passive device for the device to operate. Furthermore, when the conventional passive device is included with a conventional logic device, the conventional logic device will end up with tall backside contacts to accommodate the thickness needed for the passive device. The tall backside contacts of the logic device can lead to tip-to-tip shorting issues.

In contrast, the thickness/depth/height H3 of the doped substrate 109 of the passive device of the disclosed invention is significantly smaller than the conventional thickness/height of the bulk substrate of the conventional passive device. This allows for a reduction in the height of the backside contacts of the logic device, which will be described in further detail below. Furthermore, the necessary current flow in the passive device can be achieved by adding additional layers, which will be describe in further detail below.

Gate 322 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. The first PD source/drain 300, the second PD source/drain 305, and the third source/drain 133 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 5:
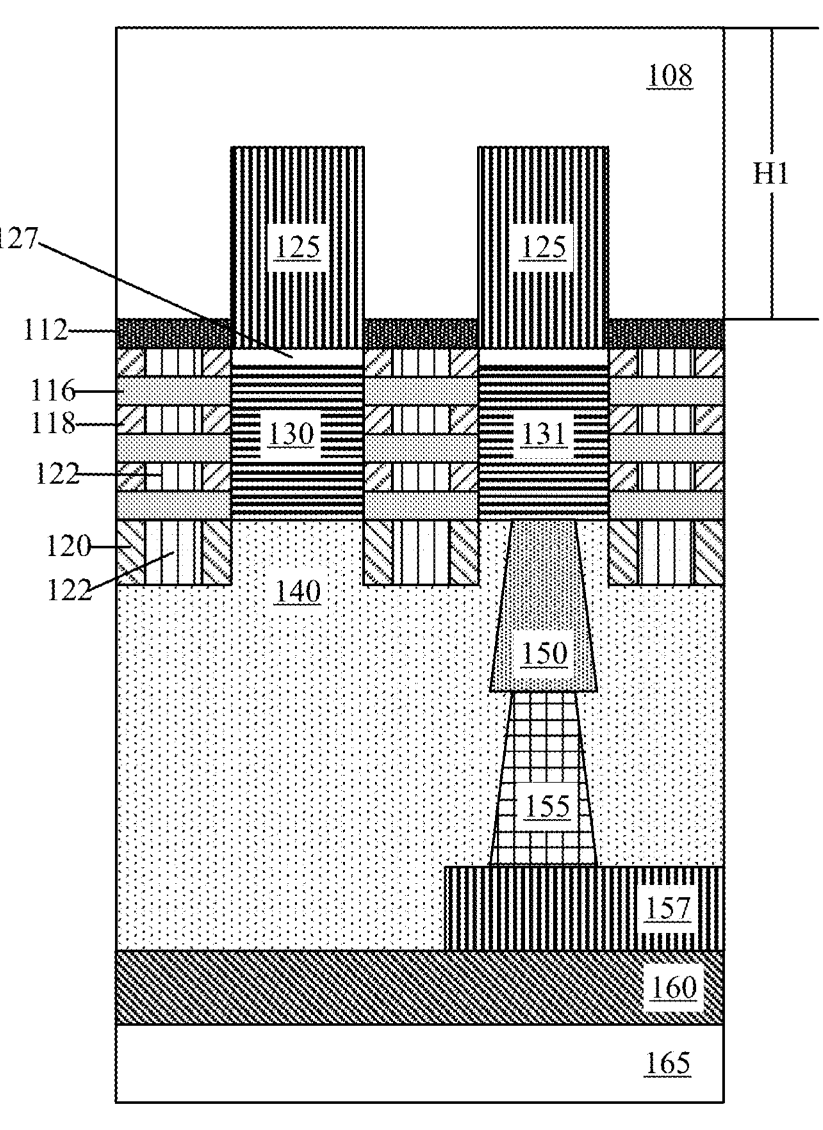
FIG. 5 illustrates a cross section X of the nano stack after flipping the logic device over for backside processing and the removal of the first substrate and the etch stop, in accordance with the embodiment of the present invention.
Figure 6:
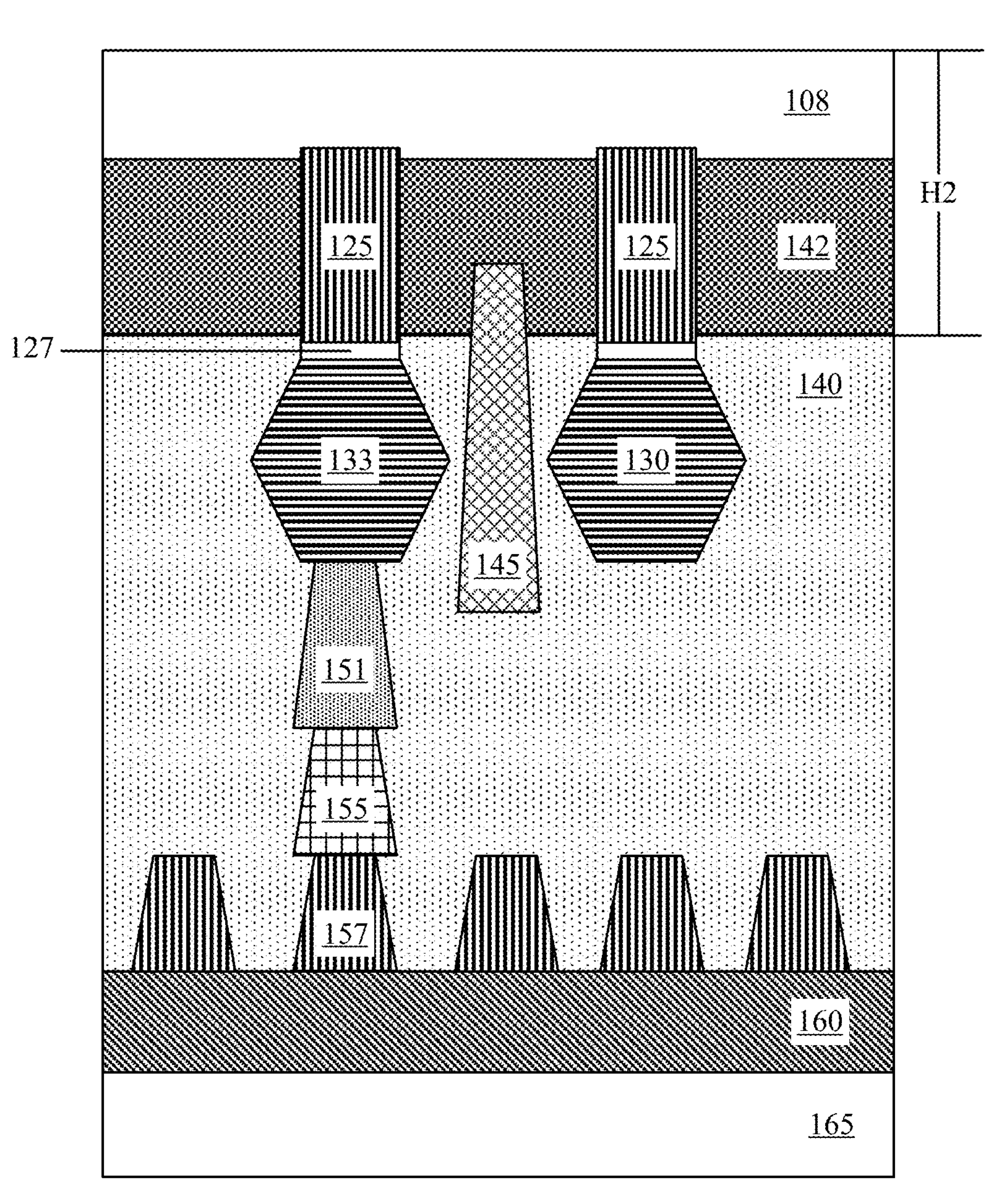
FIG. 6 illustrates a cross section Y of the source/drain region of the logic device after flipping the logic device over for backside processing and the removal of the first substrate and the etch stop, in accordance with the embodiment of the present invention.
Figure 7:
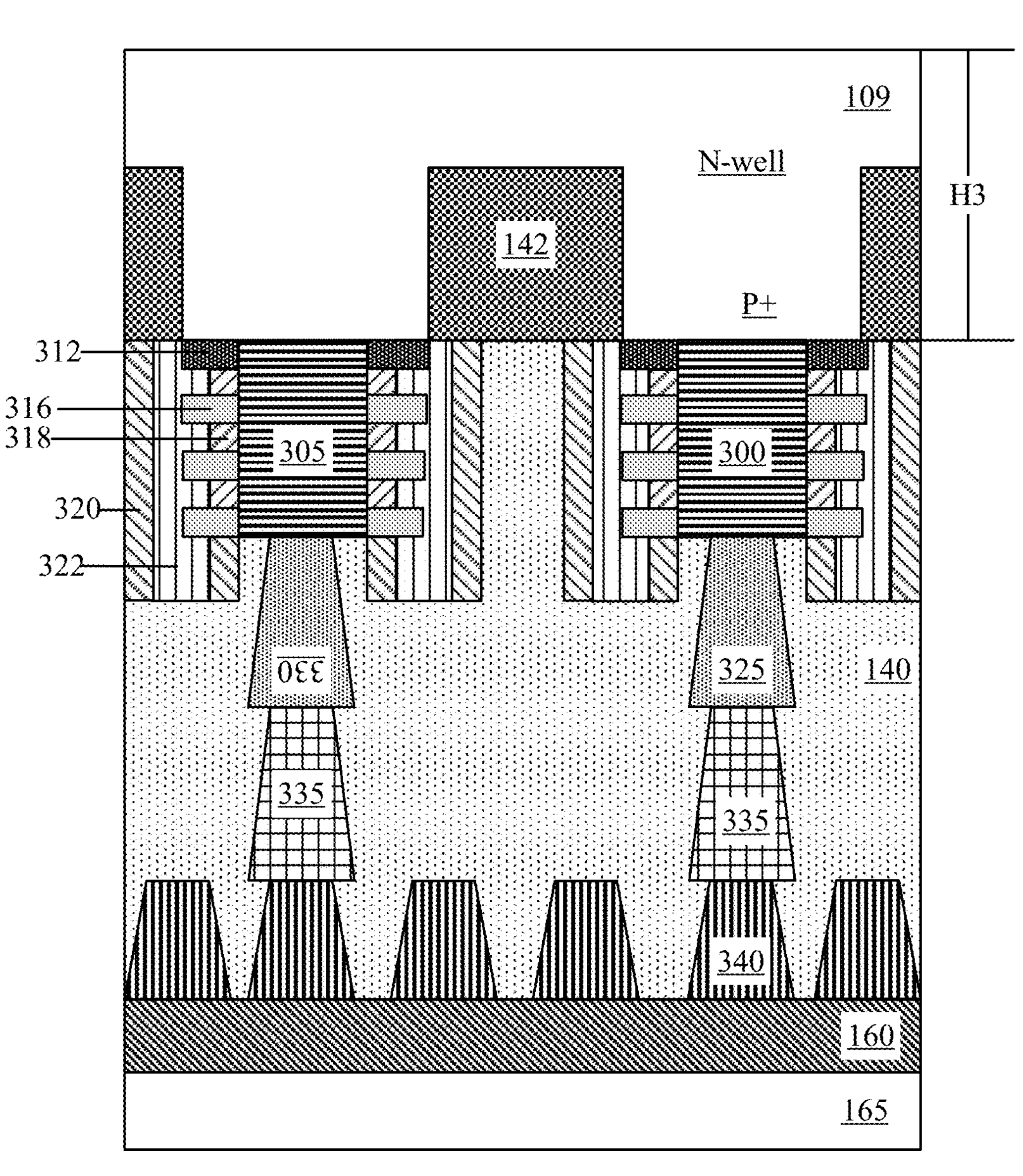
FIG. 7 illustrates a cross section of the passive device after flipping the passive device over for backside processing and the removal of the first substrate and the etch stop, in accordance with the embodiment of the present invention.

FIGS. 5, 6 and 7 illustrate the processing stage of the structure after wafer flipping and the first substrate 105 removal, stopping on etch stop 106, followed by etch stop 106 removal. The logic device and the passive device are located on the same wafer, so that when the wafer is flipped over, then both the logic device and the passive device are simultaneously flipped over to process the backside of the logic device and the passive device together. After the logic device is flipped over, then the first substrate 105 is removed by, for example, chemical mechanical process (CMP) to expose the etch top 106. The etch stop 106 is removed to expose the underlying second substrate 108. FIG. 7 illustrates the processing stage of the structure of the passive device after flipping the passive device over for backside processing. After the passive device is flipped over, then the first substrate 105 is removed by, for example, chemical mechanical process (CMP) to expose the etch top 106. The etch stop 106 is removed to expose the underlying doped second substrate 109.

Figure 8:
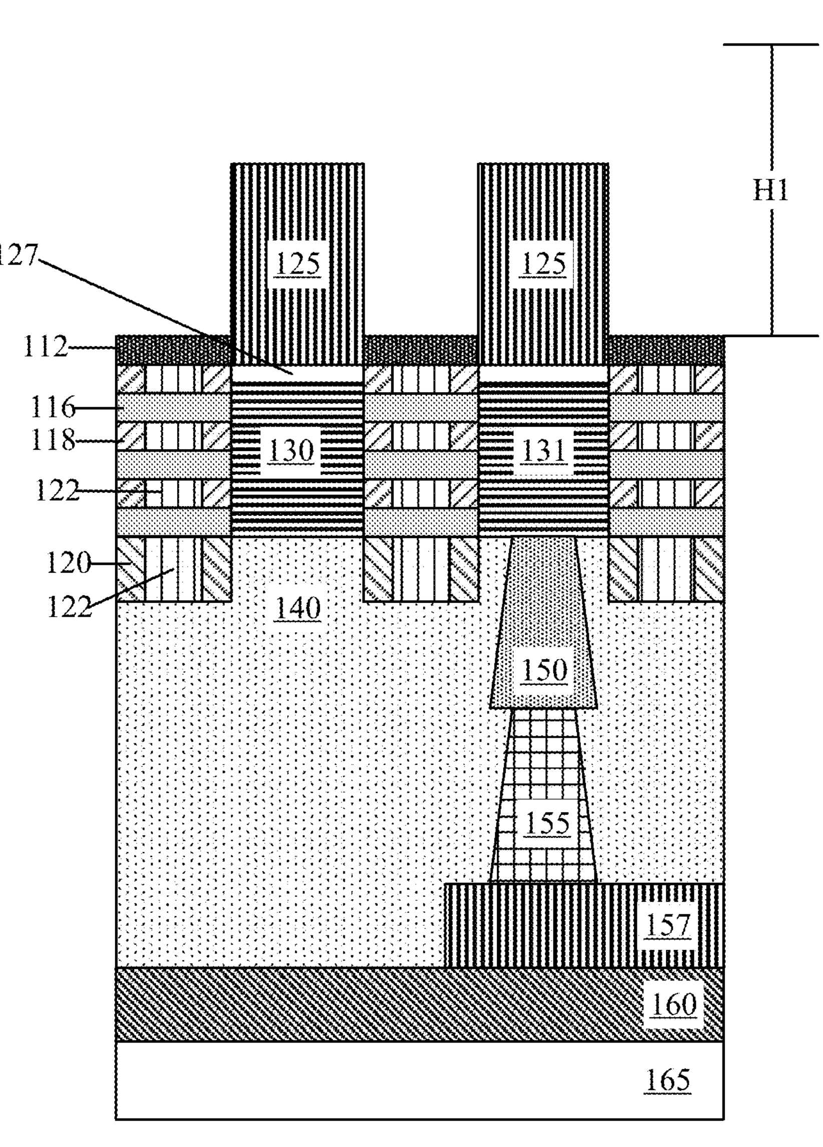
FIG. 8 illustrates a cross section X of the nano stack after removal of the second substrate, in accordance with the embodiment of the present invention.
Figure 9:
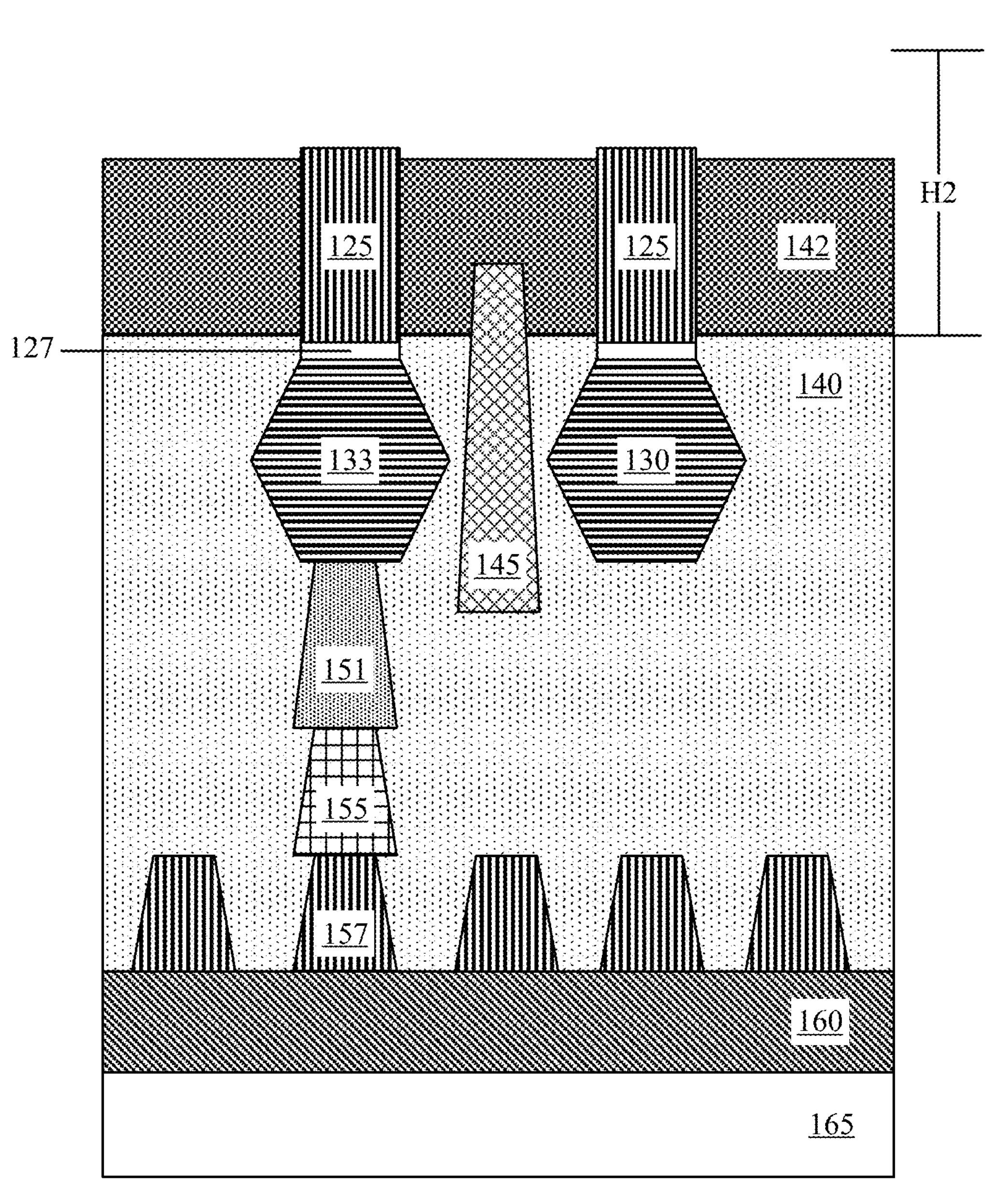
FIG. 9 illustrates a cross section Y of the source/drain region of the logic device after removal of the second substrate, in accordance with the embodiment of the present invention.
Figure 10:
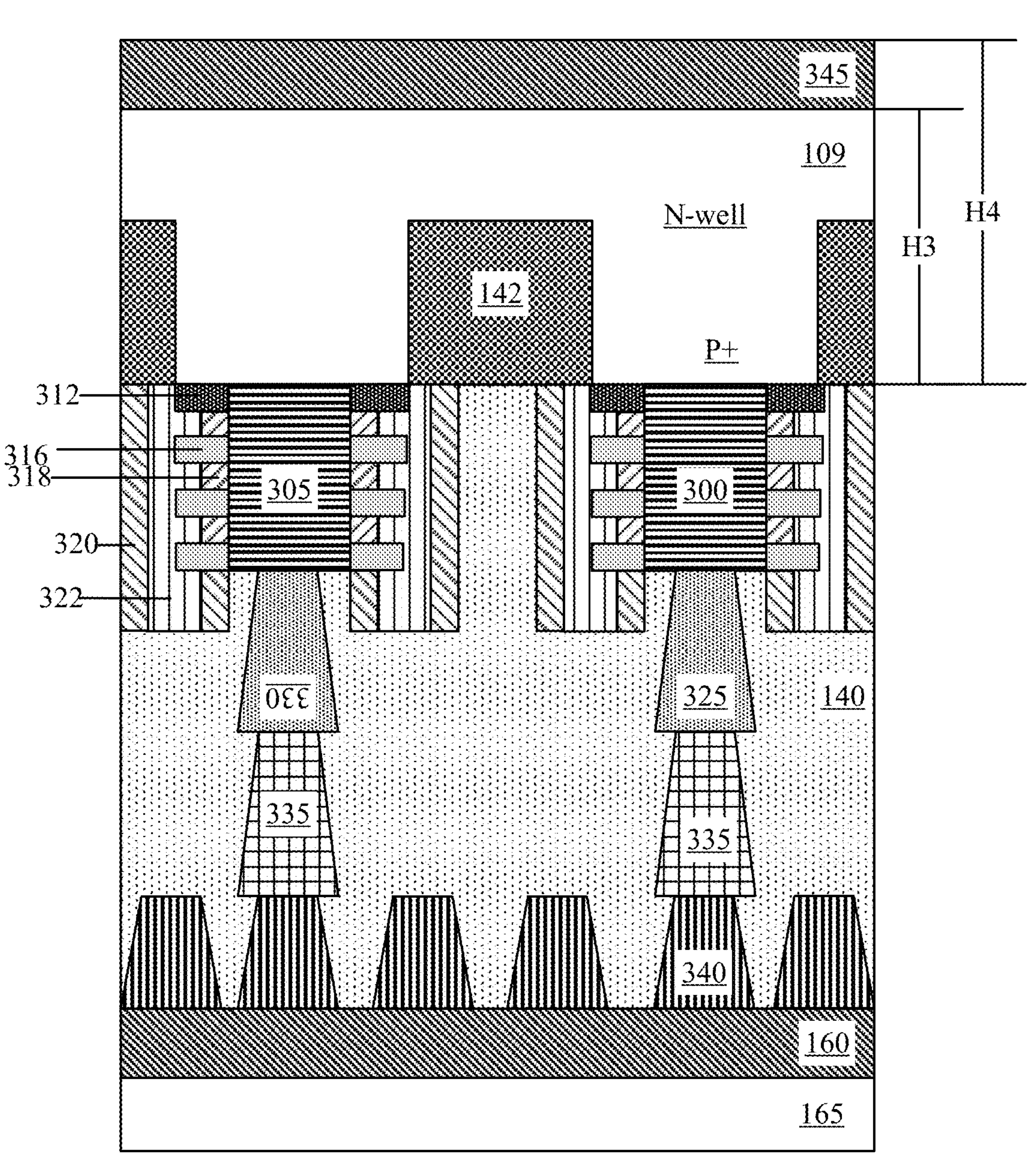
FIG. 10 illustrates a cross section of the passive device after formation of a hardmask to protect the doped second substrate, in accordance with the embodiment of the present invention.

FIGS. 8, 9, and 10 illustrate the processing stage of remaining second substrate 108 removal for logic device while the doped second substate 109 of the passive device is protected by a hardmask 345. FIG. 10 illustrates the processing stage of the structure of the passive device after the formation of a hardmask 345. A hardmask 345 is formed on top of a backside surface of the doped second substrate 109. The hardmask 345 prevent the doped second substrate 108 from being removed during the removal of the second substrate 108 of the logic device. The combined height/thickness/depth H4 of the doped second substrate 109 and the hardmask 345 is in the range of about 30 to 80 nm, thus the height/thickness/depth of the hardmask 345 is in the range of 10 to 30 nm. FIGS. 8 and 9 illustrate the processing stage of the logic device structure after removal of the second substrate 108. The second substrate 108 is removed to expose the placeholders 125, the bottom dielectric isolation layer 112, and a backside surface of the shallow trench isolation layer 142.

Figure 11:
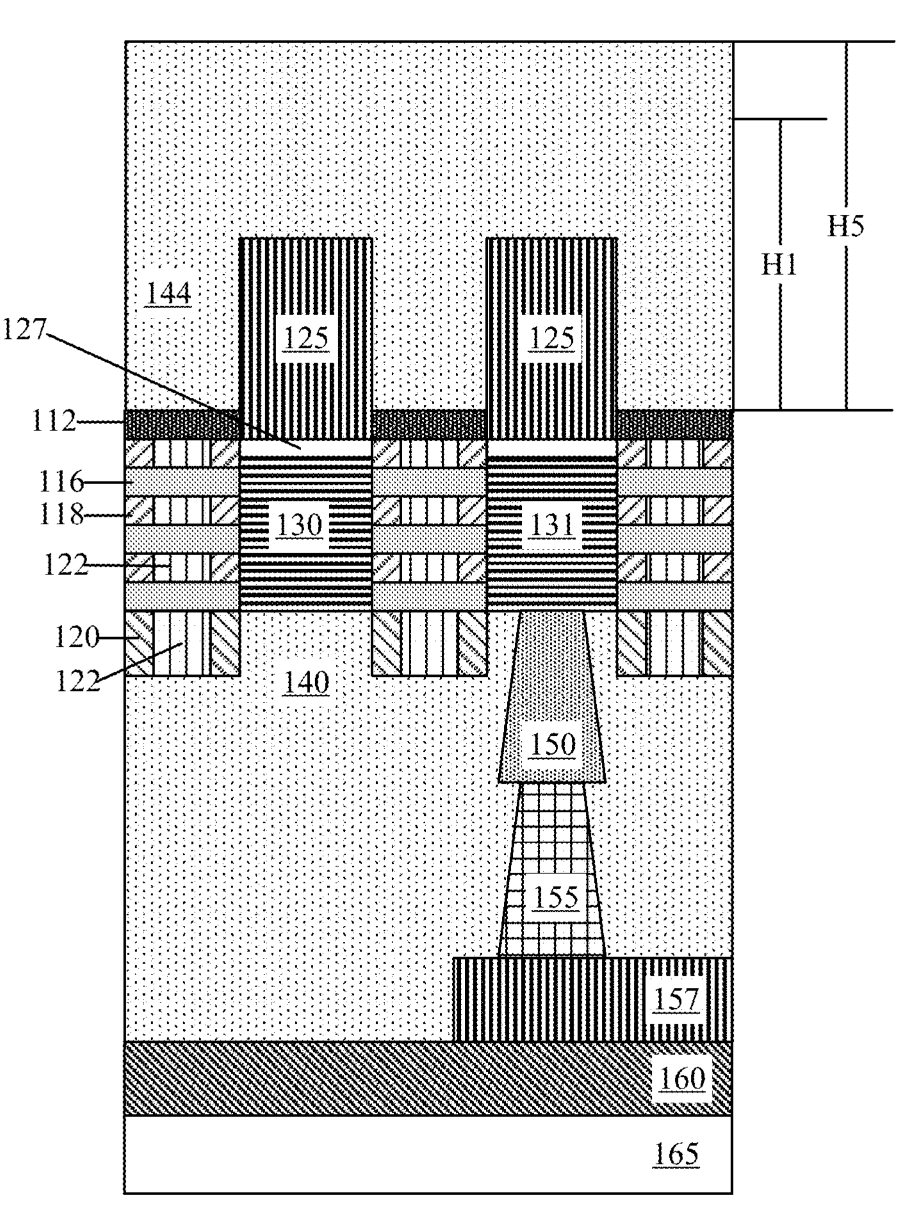
FIG. 11 illustrates a cross section X of the nano stack after formation of a backside interlayer dielectric layer, in accordance with the embodiment of the present invention.
Figure 12:
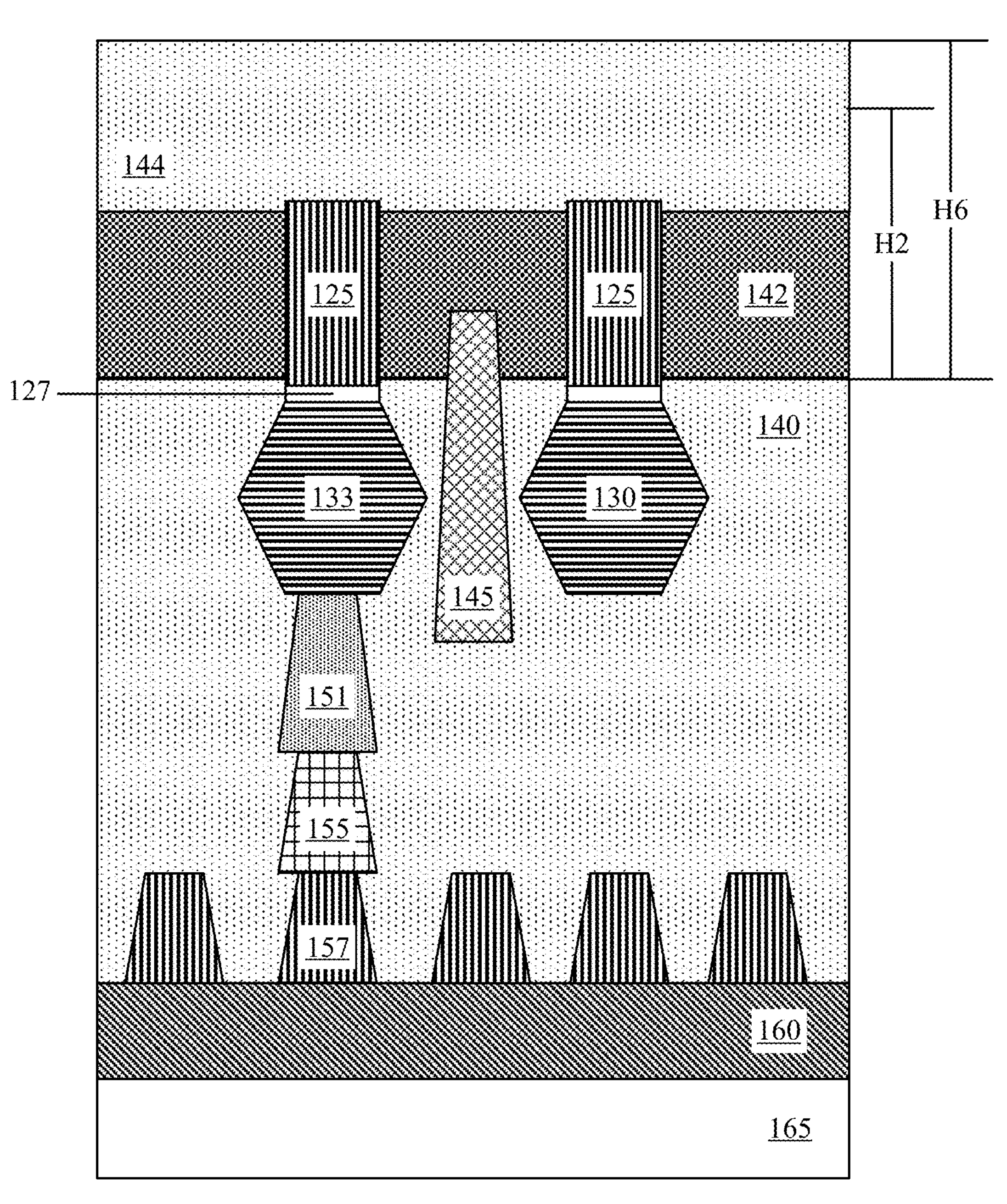
FIG. 12 illustrates a cross section Y of the source/drain region of the logic device after formation of a backside interlayer dielectric layer, in accordance with the embodiment of the present invention.
Figure 13:
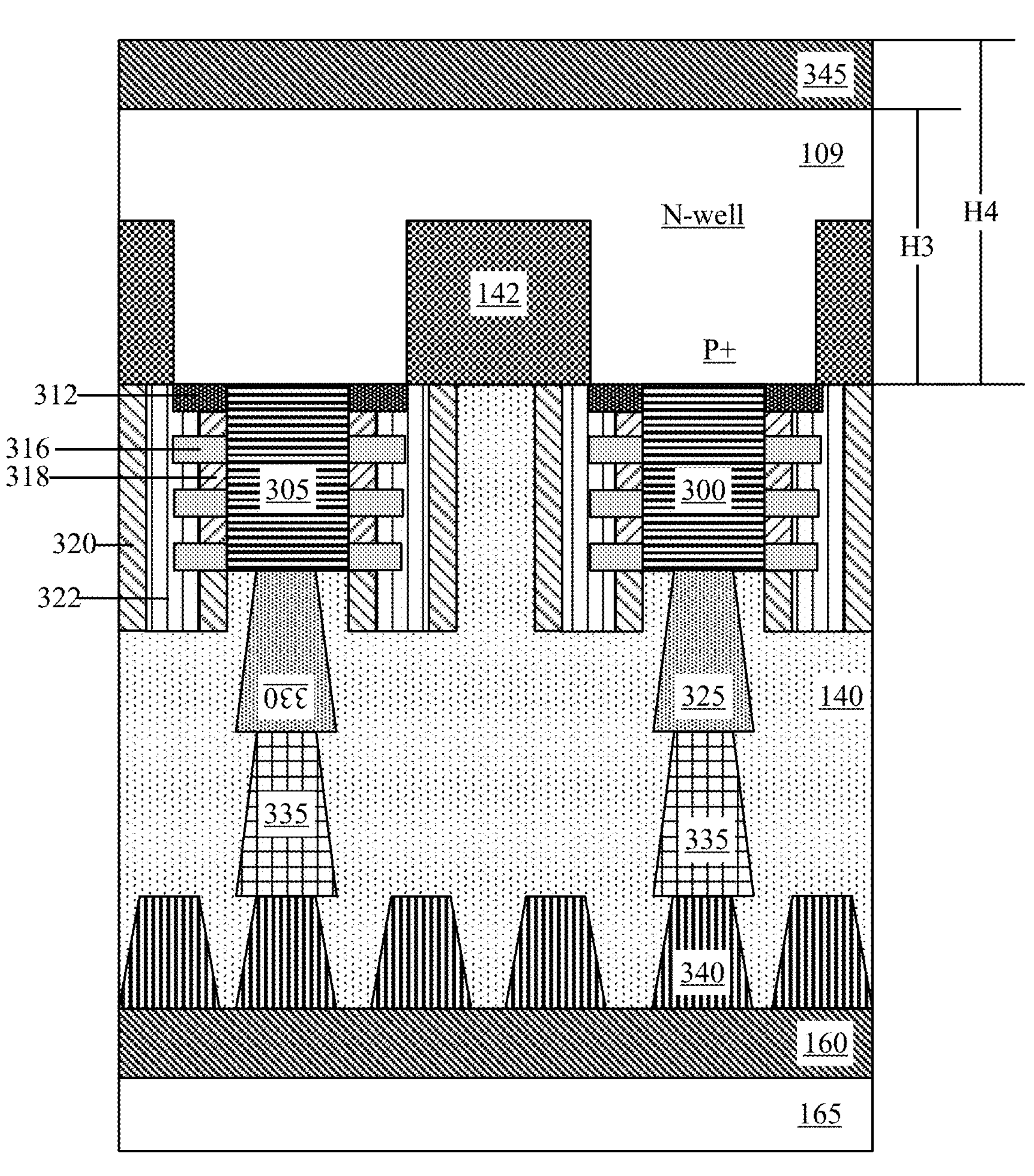
FIG. 13 illustrates a cross section of the passive after formation of a backside interlayer dielectric layer, in accordance with the embodiment of the present invention.

FIGS. 11, 12 and 13 illustrate the processing stage after deposition of backside interlayer dielectric layer 144 followed by backside interlayer dielectric layer 144 by, for example, chemical mechanical processing. A backside interlayer dielectric layer 144 is formed on the exposed surface of the bottom dielectric isolation layer 112 and encloses the placeholders 125. The backside interlayer dielectric layer 144 has a height/depth/thickness H5 that is in the range of about 30 to 80 nm. The height/depth/thickness H5 is substantially equal to the combined height/thickness/depth H4.

The top surface of the backside interlayer dielectric layer 144 of the logic device is substantially uniform with a top surface of the hardmask 345 of the passive device. FIG. 12 illustrates that the backside interlayer dielectric layer 144 is located on the backside surface of the shallow trench isolation layer 142 and the placeholders 125. The combined height/thickness/depth H6 of the shallow trench isolation layer 142 and the backside interlayer dielectric layer 144 is in the range of 30 to 80 nm. The combined height/depth/thickness H6 is substantially equal to the combined height/thickness/depth H4.

Figure 14:
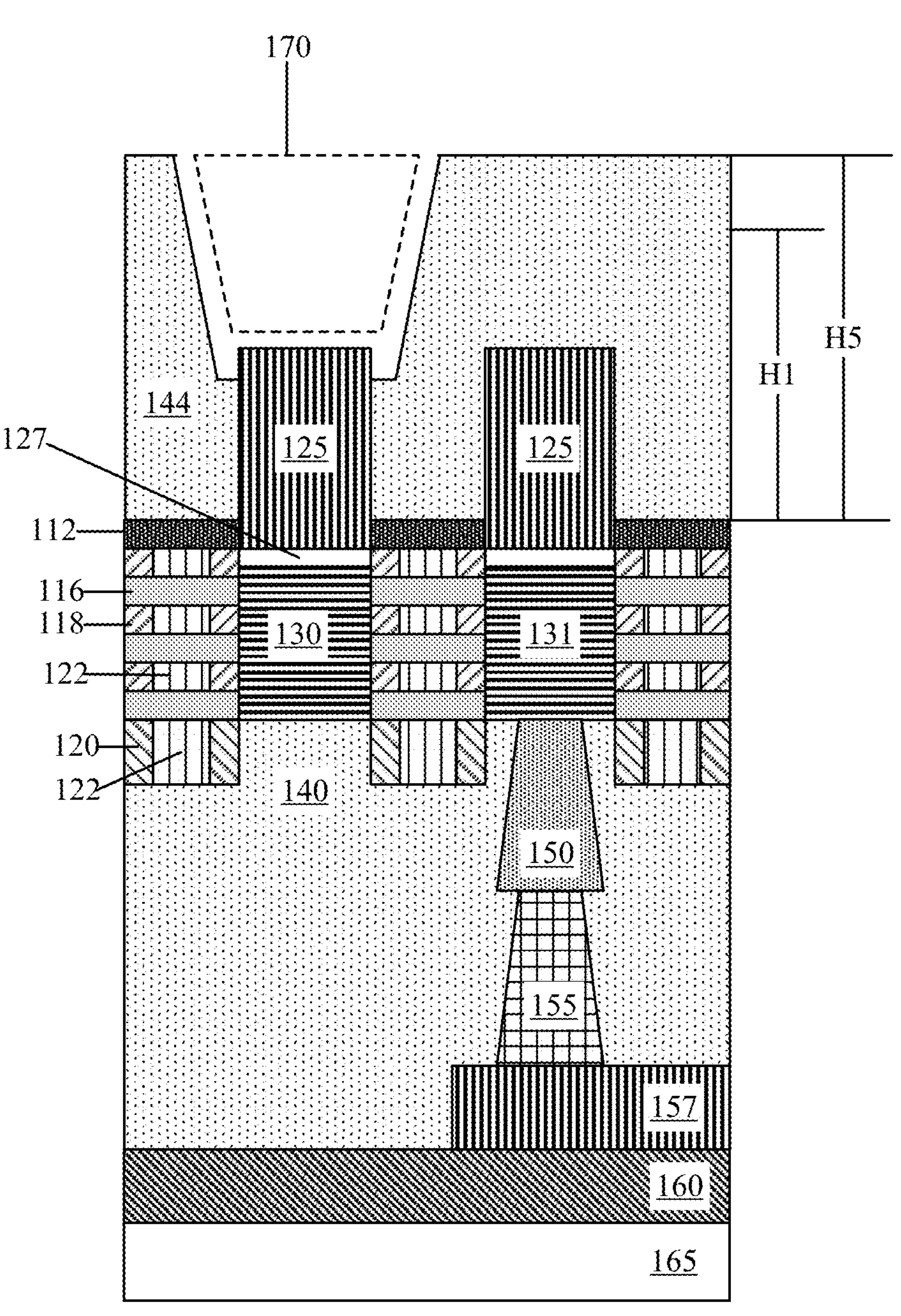
FIG. 14 illustrates a cross section X of the nano stack after formation of a backside contact trench, in accordance with the embodiment of the present invention.
Figure 15:
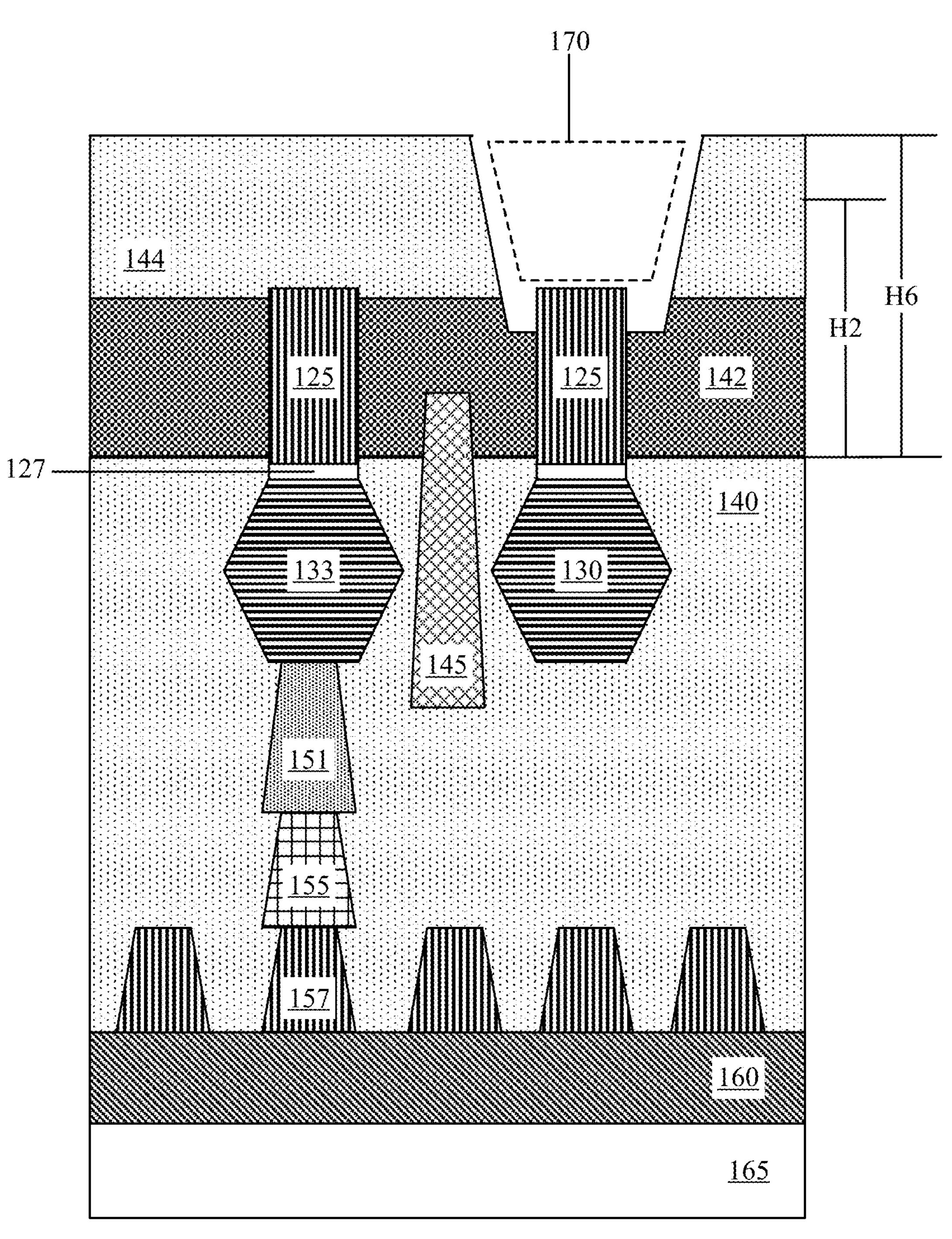
FIG. 15 illustrates a cross section Y of the source/drain region of the logic device after formation of a backside contact trench, in accordance with the embodiment of the present invention.
Figure 16:
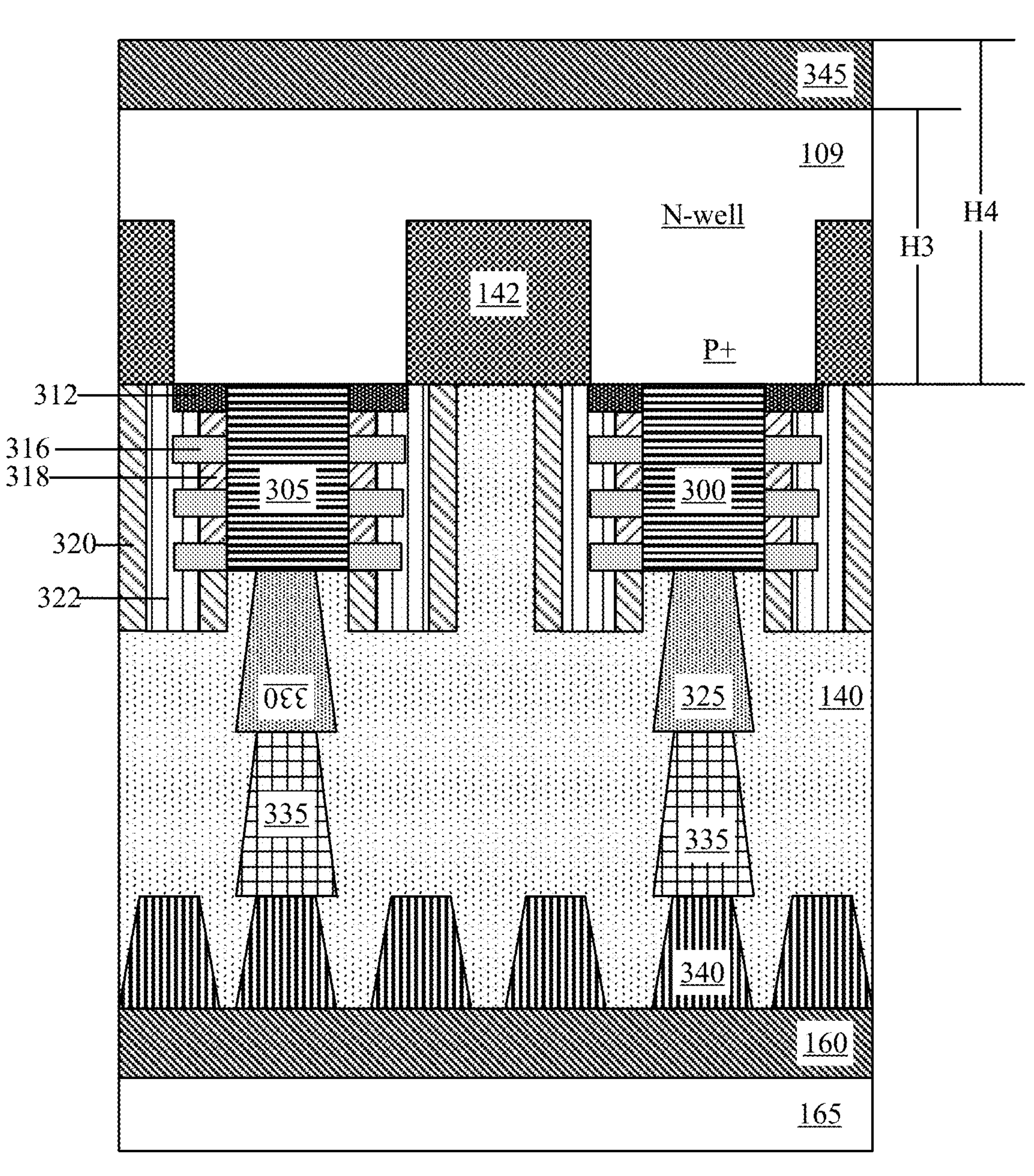
FIG. 16 illustrates a cross section of the passive after formation of a backside contact trench, in accordance with the embodiment of the present invention.

FIGS. 14, 15 and 16 illustrate the processing stage after backside contact trench 170 patterning. At least one backside contact trench 170 is formed in the backside interlayer dielectric layer 144. At least one backside contact trench 170 exposes one of the placeholders 125, as illustrated in FIGS. 14 and 15, where the placeholder 125 is located on the backside of the substrate spacer 127 that was formed on the backside surface of the first source/drain 130.

Figure 17:
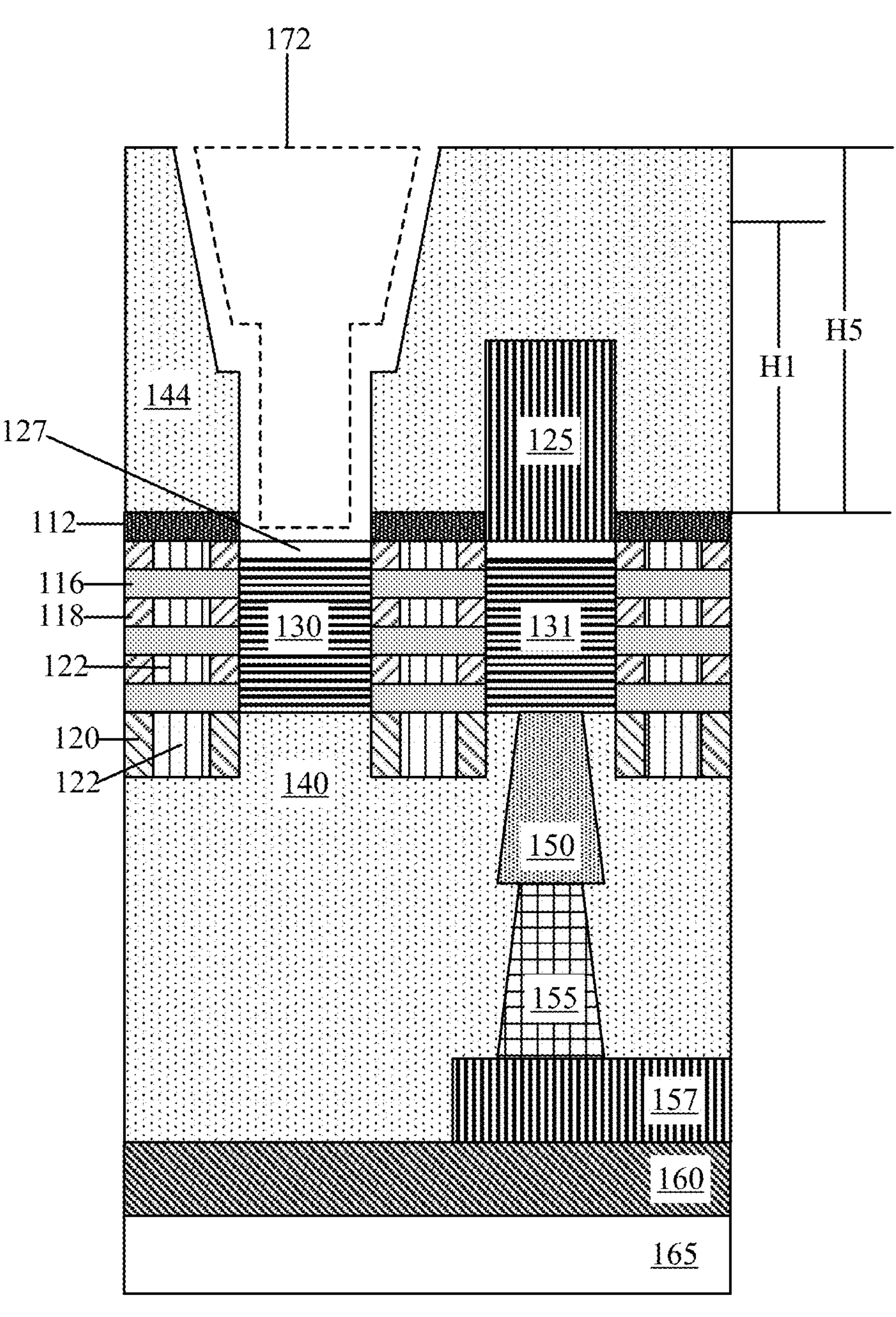
FIG. 17 illustrates a cross section X of the nano stack after removal of the placeholder, in accordance with the embodiment of the present invention.
Figure 18:
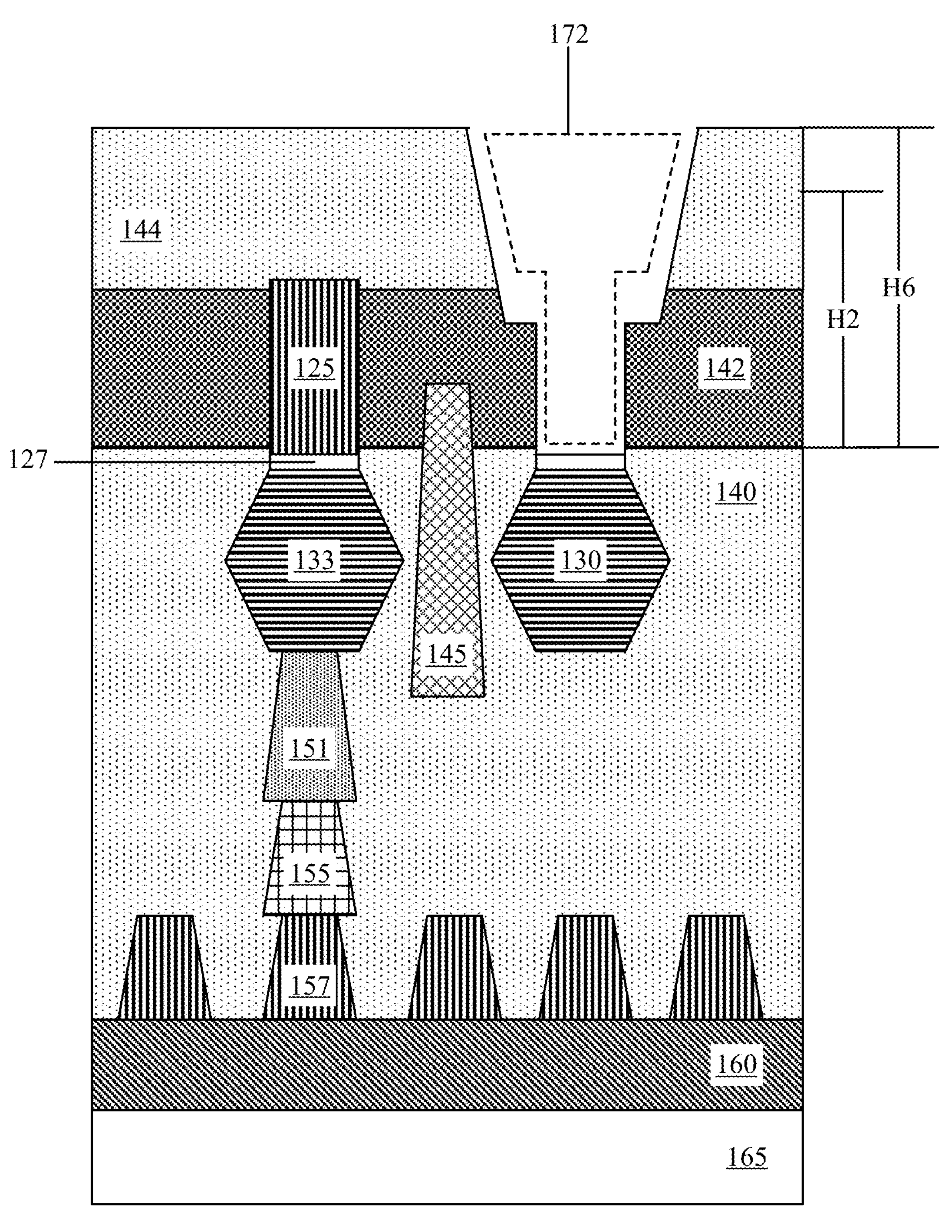
FIG. 18 illustrates a cross section Y of the source/drain region of the logic device after removal of the placeholder, in accordance with the embodiment of the present invention.
Figure 19:
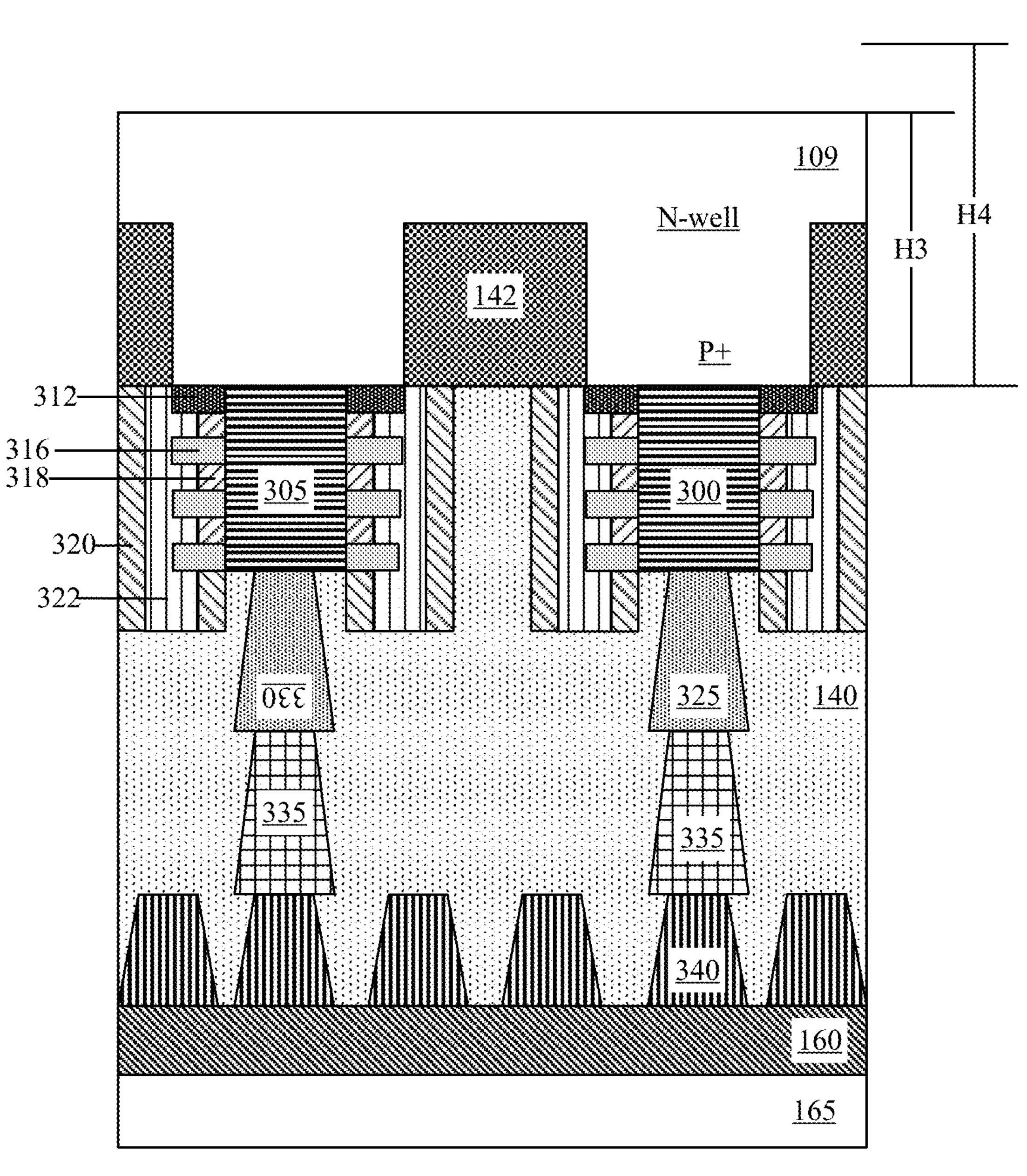
FIG. 19 illustrates a cross section of the passive after removal of the hardmask, in accordance with the embodiment of the present invention.

FIGS. 17, 18 and 19 illustrate the processing stage after removal of hardmask 345 followed by removal of exposed placeholder 125. The placeholder 125 that was exposed by the backside contact trench 170 is removed (as illustrated by dashed box 172). The removal of the placeholder 125 exposed a backside surface of the substrate spacer 127. As illustrated in FIG. 19, hardmask 345 is removed to expose the backside surface of the doped substrate 109.

Figure 20:
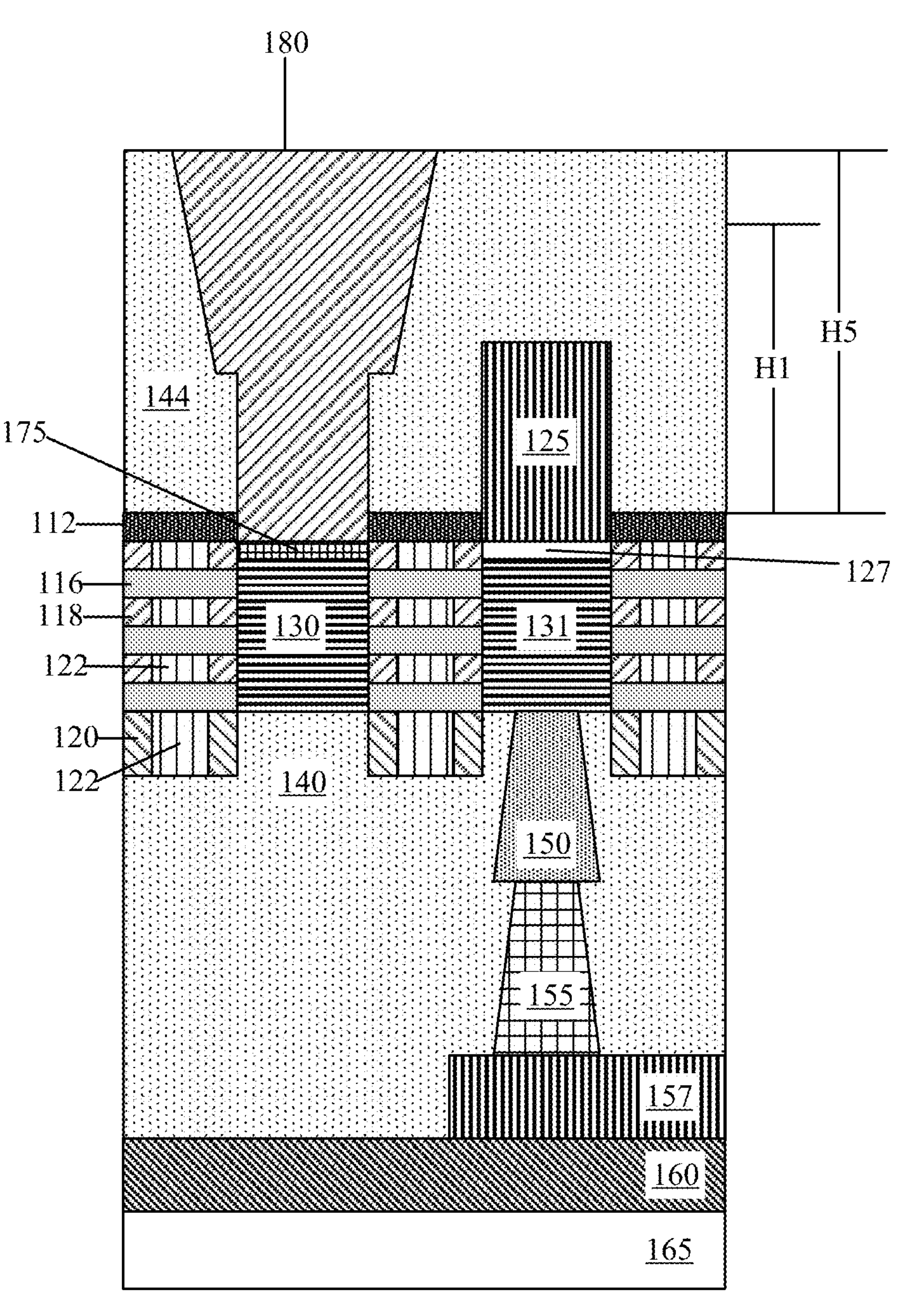
FIG. 20 illustrates a cross section X of the nano stack after a metallization process, in accordance with the embodiment of the present invention.
Figure 21:
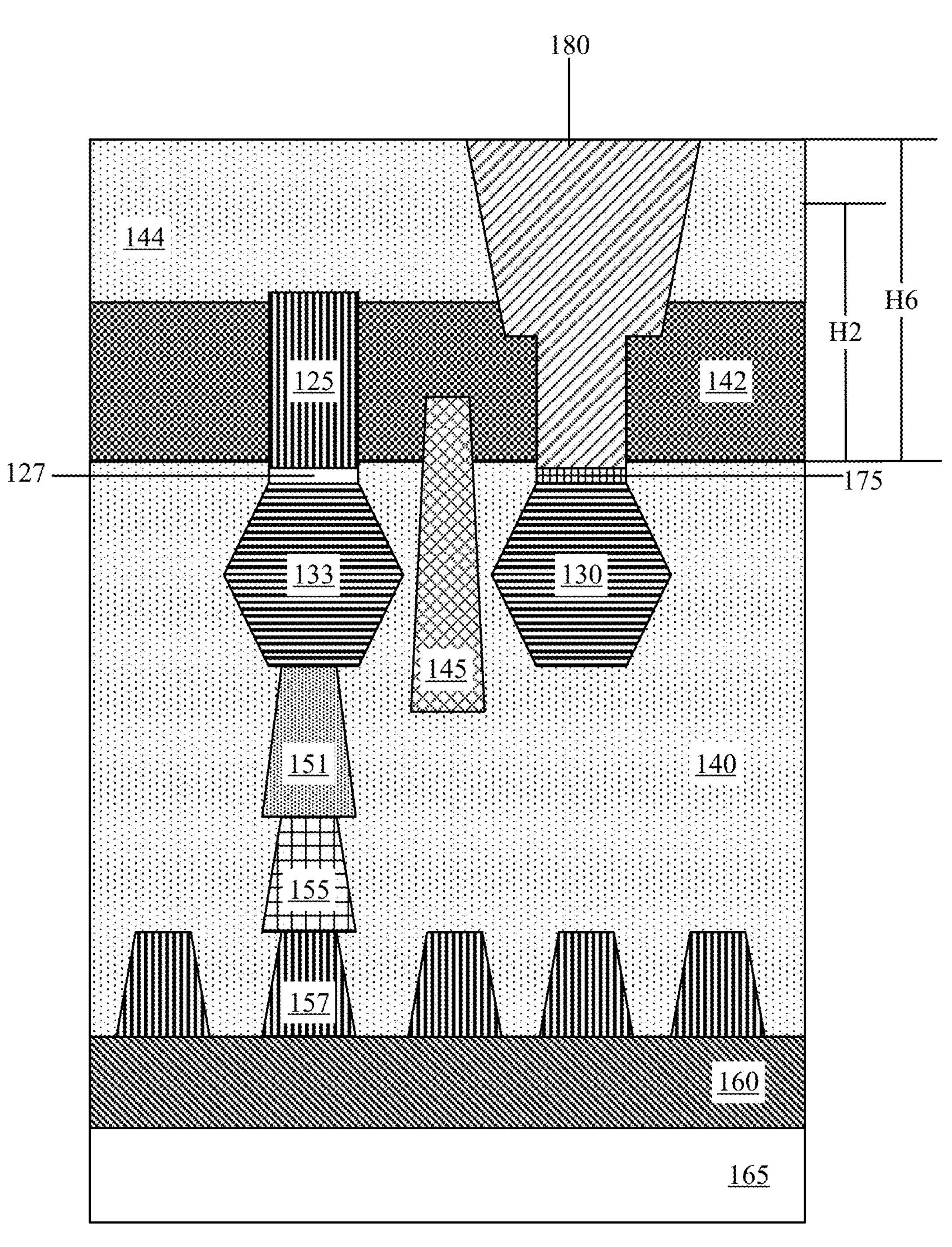
FIG. 21 illustrates a cross section Y of the source/drain region of the logic device after a metallization process, in accordance with the embodiment of the present invention.
Figure 22:
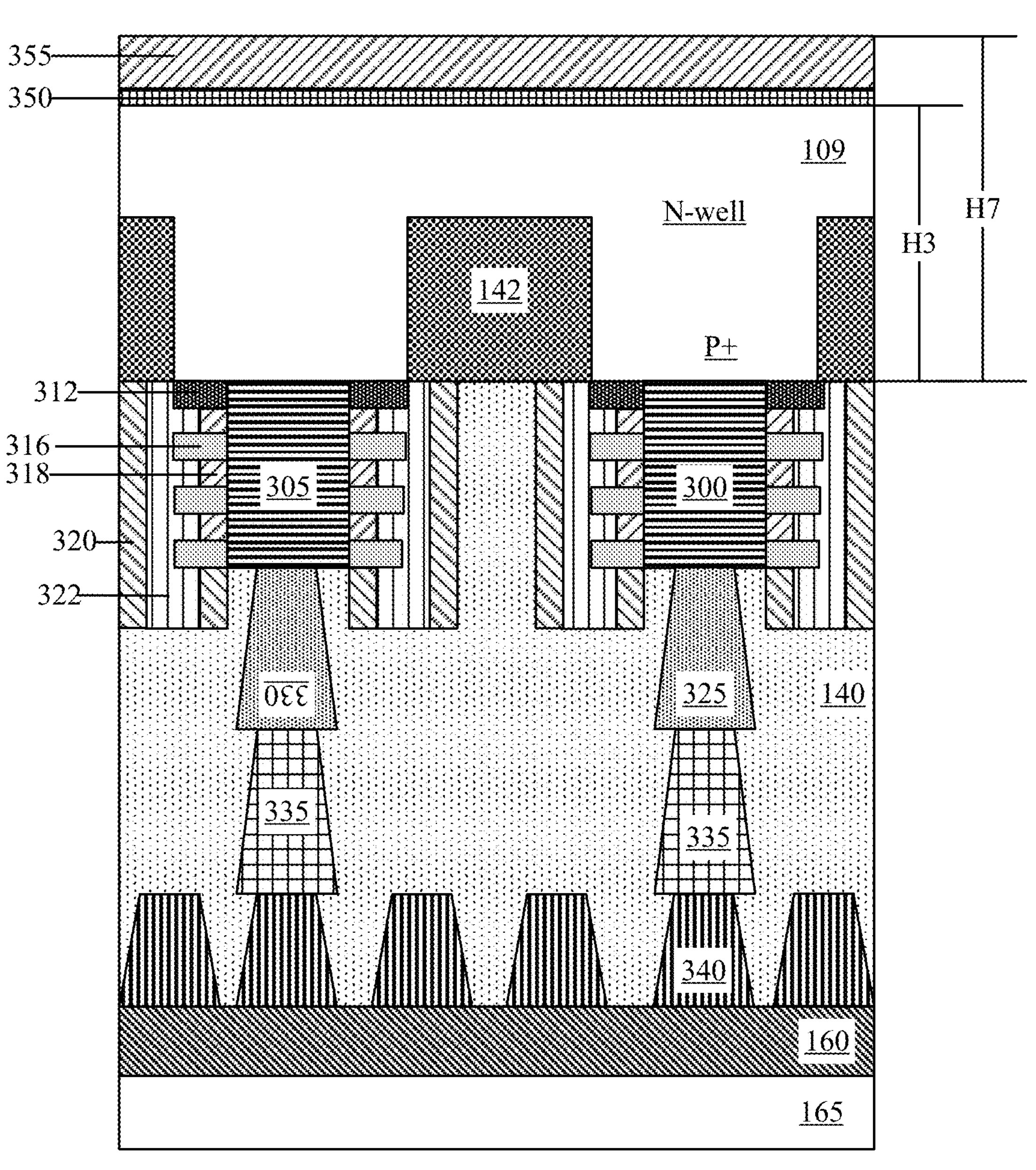
FIG. 22 illustrates a cross section of the passive after a metallization process, in accordance with the embodiment of the present invention.

FIGS. 20, 21 and 22 illustrate the processing stage of backside metallization process for backside contact 180 formation for both logic device and passive device. A metallization process is utilized to form a silicide layer 175 and to form the backside contact 180. The silicide layer 175 can be formed independent of the process to form the backside contact 180 or the silicide layer 175 can be formed as part of the process to form the backside contact 180. The top surface of the backside contact 180 is uniform with the top surface of the backside interlayer dielectric layer 144.

As illustrated in FIG. 22 a PD silicide layer 350 is formed on the backside surface of the doped second substrate 109. PD silicide layer 350 forms an uniform plane of silicide material across the backside surface of the doped second substrate 109. A metal plane 355 is formed on top of the silicide layer 350. Metal plane 355 forms a uniform plane of conductive material across the backside surface of the silicide layer 350. The combined height/thickness/depth H7 of the doped second substrate 109, the silicide layer 350, and the metal plane 355 is in the range of about 30 to 80 nm, thus the combined height/thickness/depth of the silicide layer 350 and the metal plane 355 is in the range of 10 to 30 nm. The top surface of metal plane 355 is substantially uniform with the top surface of the backside contact 180 and the top surface of the metal plane 355 is substantially uniform with the top surface of the backside interlayer dielectric layer 144. The combined height/thickness/depth H7 is substantially equal to the combined height/thickness/depth H6 and to the height/thickness/depth H5. The silicide layer 350 and the metal plane 355 improves the current flow through the doped second substrate 109, thus the combination of the silicide layer 350 and the metal plane 355 allows for a reduction of the thickness/depth/height of the doped second substrate 109 of the passive device. Furthermore, the combination of these layers allowed for the reduction in the height/thickness/depth of the backside contacts 180, thus reducing the chance of a short from the tip-to-tip spacing of adjacent backside contacts 180.

Figure 23:
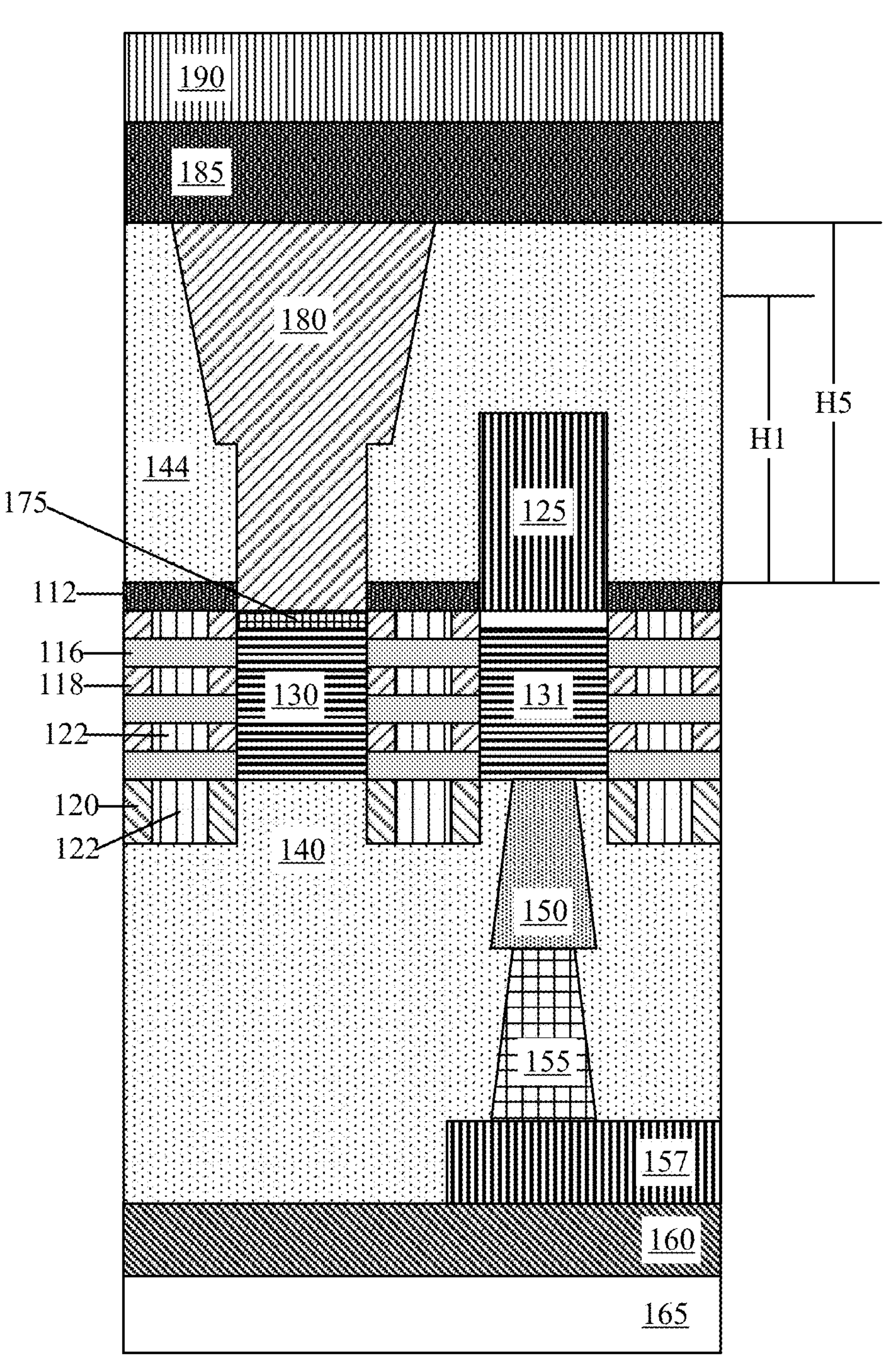
FIG. 23 illustrates a cross section X of the nano stack after formation of a buried power rail and a backside-power-distribution-network (BSPDN), in accordance with the embodiment of the present invention.
Figure 24:
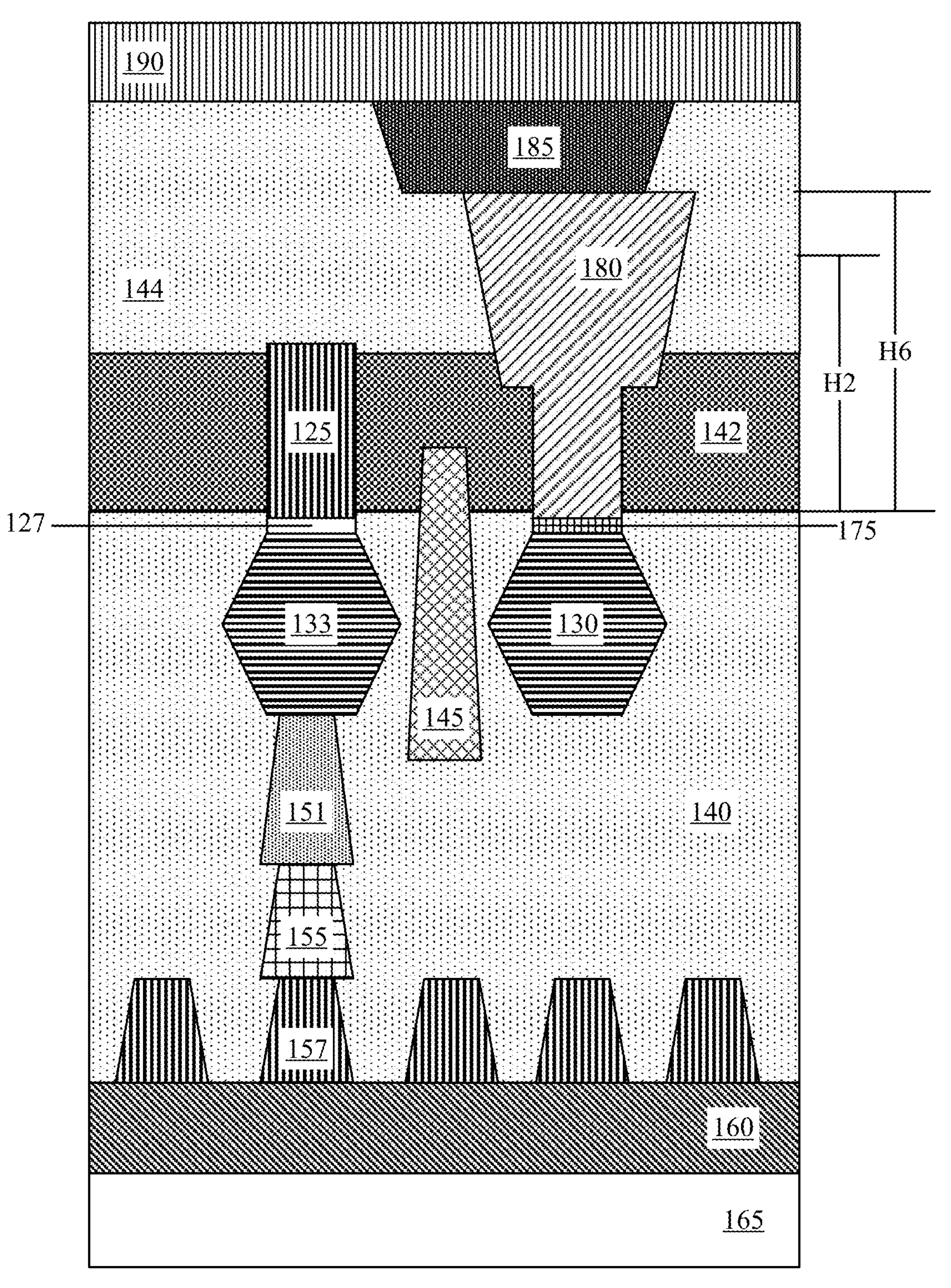
FIG. 24 illustrates a cross section Y of the source/drain region of the logic device after formation of a buried power rail and a backside-power-distribution-network (BSPDN), in accordance with the embodiment of the present invention.
Figure 25:
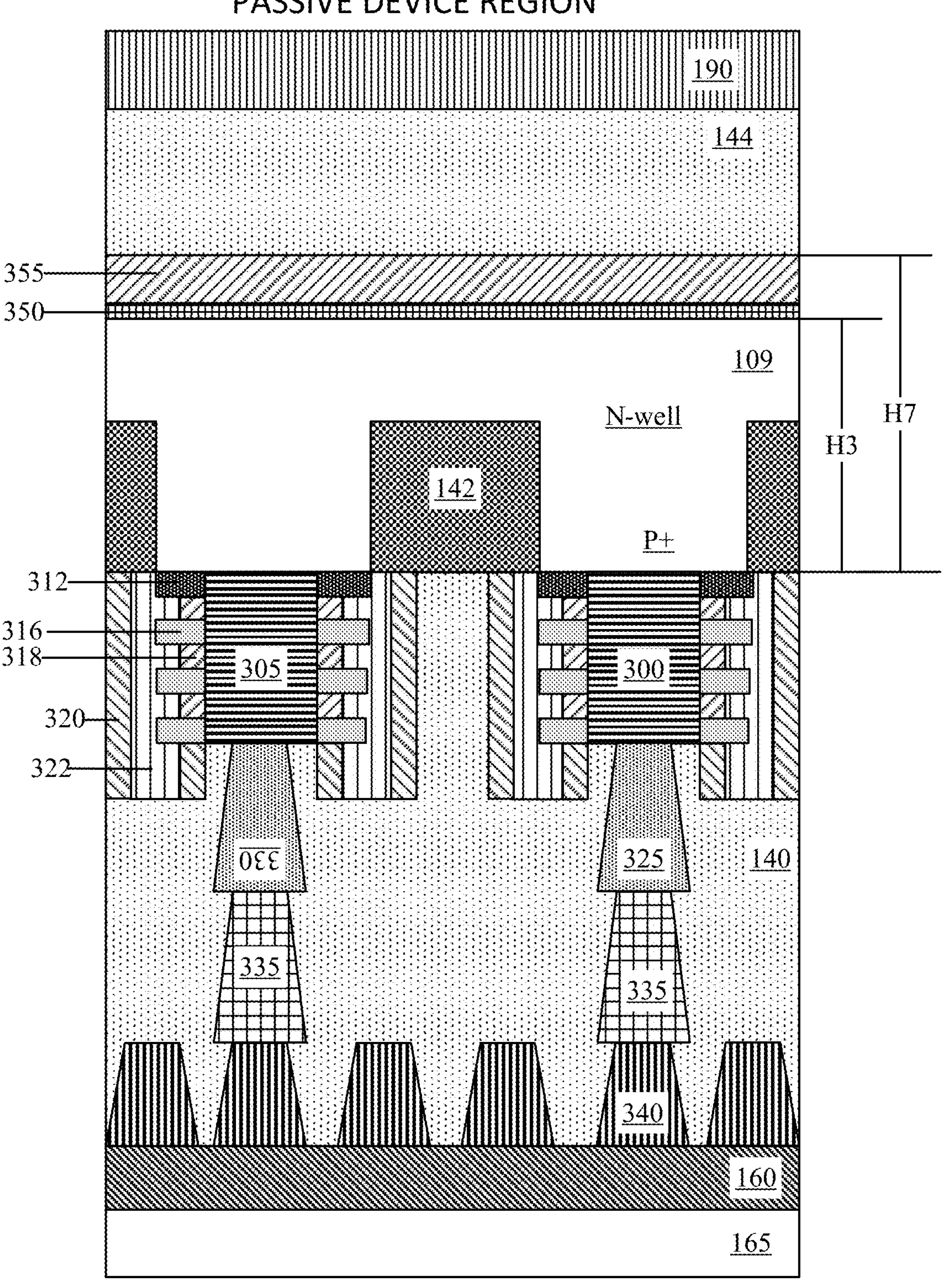
FIG. 25 illustrates a cross section of the passive after formation of the backside interlayer dielectric layer and the backside-power-distribution-network (BSPDN), in accordance with the embodiment of the present invention.

FIGS. 23, 24 and 25 illustrate the processing stage after deposition of backside interlayer dielectric layer 144, formation of backside power rail or metal line 185 and backside power distribution network 190. Additional backside interlayer dielectric material is added to increase the height of the backside interlayer dielectric layer 144 and to form a backside interlayer dielectric layer 144 on the top surface of the metal plane 355 of the passive device. A trench (not shown) is formed in the backside interlayer dielectric layer 144, where the trench exposed a backside surface of the backside contact 180. The trench is filled in with a conductive material to form a metal line 185, for example, the metal line 185 can be a backside power rail or a signal line. A backside-power-distribution-network (BSPDN) 190 is formed on top of the metal line 185 and on top of the backside interlayer dielectric layer 144 located in the logic and passive device.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
- a logic device; and
- a passive device, wherein the passive device includes:
  - a doped substrate;
  - a plurality of source/drains;
  - a silicide layer located on a backside surface of the doped substrate, wherein the silicide layer forms a uniform plane that extends laterally across the plurality of source/drains, wherein the silicide layer is in continuous contact with the backside surface of the doped substrate as it extends across the plurality of source/drains;
  - a metal plane located on a backside surface of the silicide layer, wherein the metal plane forms a uniform plane that extends continuously across the surface of the silicide layer; and
  - a backside interlayer dielectric layer located on the backside surface of the metal plane.

2. The microelectronic structure of claim 1, wherein the doped substrate has a height/depth in the range of about 20 to 50 nm.

3. The microelectronic structure of claim 2, wherein the silicide layer and the metal plane have a combined height/depth in the range of about 10 to 30 nm.

4. The microelectronic structure of claim 1, wherein a combined height/depth of the doped substrate, the silicide layer, and the metal plane is in the range of about 30 to 80 nm.

5. The microelectronic structure of claim 4, wherein the silicide layer forms a single uniform layer across the backside surface of the doped substrate, and wherein the metal plane forms a single uniform layer across the backside surface of the silicide layer.

6. The microelectronic structure of claim 5, wherein the silicide layer and the metal plane increases the current flow through the doped substrate.

7. The microelectronic structure of claim 1, wherein the passive device is a diode.

8. A microelectronic structure comprising:

a logic device that includes a backside contact; and a passive device, wherein the passive device includes:

a doped substrate;

a plurality of source/drains;

a silicide layer located on a backside surface of the doped substrate, wherein the silicide layer forms a uniform plane that extends laterally across the plurality of source/drains, wherein the silicide layer is in continuous contact with the backside surface of the doped substrate as it extends across the plurality of source/drains;

a metal plane located on a backside surface of the silicide layer, wherein the metal plane forms a uniform plane that extends continuously across the surface of the silicide layer; and a backside interlayer dielectric layer located on the backside surface of the metal plane.

9. The microelectronic structure of claim 8, wherein the doped substrate has a height/depth in the range of about 20 to 50 nm.

10. The microelectronic structure of claim 9, wherein the silicide layer and the metal plane have a combined height/depth in the range of about 10 to 30 nm.

11. The microelectronic structure of claim 8, wherein a combined height/depth of the doped substrate, the silicide layer, and the metal plane is in the range of about 30 to 80 nm.

12. The microelectronic structure of claim 11, wherein the silicide layer forms a single uniform layer across the backside surface of the doped substrate, and wherein the metal plane forms a single uniform layer across the backside surface of the silicide layer.

13. The microelectronic structure of claim 12, wherein the silicide layer and the metal plane increases the current flow through the doped substrate.

14. The microelectronic structure of claim 11, wherein the logic device further comprises:

a source/drain; and a second silicide layer located on the backside surface of the source/drain.

15. The microelectronic structure of claim 14, wherein the backside contact is connected to a backside surface of the second silicide layer.

16. The microelectronic structure of claim 15, wherein the backside contact has a height/depth in the range of about 30 to 80 nm.

17. The microelectronic structure of claim 16, wherein the backside contact has a height/depth is substantially equal to the combined height/depth of the doped substrate, the silicide layer, and the metal plane.

18. The microelectronic structure of claim 8, wherein a backside surface of the backside contact of the logic device is substantially uniform/planar with the backside surface of the metal plane of the passive device.

19. The microelectronic structure of claim 8, wherein the passive device is a diode.

20. A method comprising:

forming a logic device that includes a backside contact; and forming a passive device, wherein the passive device includes:

a doped substrate;

a plurality of source/drains;

a silicide layer located on a backside surface of the doped substrate, wherein the silicide layer forms a uniform plane that extends laterally across the plurality of source/drains, wherein the silicide layer is in continuous contact with the backside surface of the doped substrate as it extends across the plurality of source/drains;

a metal plane located on a backside surface of the silicide layer, wherein a combined height/depth of the doped substrate, the silicide layer, and the metal plane is in the range of about 30 to 80 nm, wherein the metal plane forms a uniform plane that extends continuously across the surface of the silicide layer; and a backside interlayer dielectric layer located on the backside surface of the metal plane.

* * * * *